United States Patent
Ochiai et al.

(10) Patent No.: US 6,627,889 B2
(45) Date of Patent: Sep. 30, 2003

(54) APPARATUS AND METHOD FOR OBSERVING SAMPLE USING ELECTRON BEAM

(75) Inventors: Isao Ochiai, Otsuki (JP); Hidemi Koike, Hitachinaka (JP); Satoshi Tomimatsu, Kokubunji (JP); Muneyuki Fukuda, Kokubunji (JP); Mitsugu Sato, Hitachinaka (JP); Tohru Ishitani, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/152,000

(22) Filed: May 22, 2002

(65) Prior Publication Data

US 2003/0089852 A1 May 15, 2003

(30) Foreign Application Priority Data

Nov. 13, 2001 (JP) ......................... 2001-346849

(51) Int. Cl.⁷ ........................... G01N 23/00; G21K 7/00
(52) U.S. Cl. .................. 250/310; 250/309; 250/311; 250/492.1
(58) Field of Search ................... 250/309, 310, 250/311, 306, 305, 307, 396 R, 492.1, 492.2; 378/215

(56) References Cited

U.S. PATENT DOCUMENTS

| 5,214,282 A | * 5/1993 | Yamaguchi et al. | 250/307 |
| 5,270,544 A | * 12/1993 | Taira | 250/310 |
| 5,525,806 A | * 6/1996 | Iwasaki et al. | 250/311 |
| 6,300,631 B1 | * 10/2001 | Shofner | 250/442.11 |
| 2001/0045511 A1 | * 11/2001 | Moore et al. | 250/221 |
| 2002/0024014 A1 | * 2/2002 | Kazumori | 250/311 |
| 2002/0050565 A1 | * 5/2002 | Tokuda et al. | 250/310 |
| 2002/0079463 A1 | * 6/2002 | Shichi et al. | 250/492.1 |
| 2002/0117628 A1 | * 8/2002 | Radley et al. | 250/397 |

FOREIGN PATENT DOCUMENTS

| JP | 55-068060 | 11/1978 |
| JP | 08-261894 | 3/1995 |

OTHER PUBLICATIONS

David C. Joy, Alton D. Romig, Jr., Joseph I. Goldstein, "Principles of Analytical Electron Microscopy", X-Ray Energy-Dispersive Spectrometry, pp. 131–135.

* cited by examiner

*Primary Examiner*—John R. Lee
*Assistant Examiner*—James P. Hughes

(57) ABSTRACT

An apparatus and method for observing a sample that is capable of making observations by irradiating an electron beam to a sample in the form of a thin film, and making elemental analysis accurately and with increased resolution while reducing background noise. A particular portion of the sample is observed by the electron beam by disposing a light element piece having a hole provided immediately behind the thin film sample. According to the present invention, it is possible to reduce the x-rays generated from portions other than the sample and electron beam incident on the sample after being scattered to portions other than the sample when observing the thin film sample by irradiating the electron beam. It is therefore possible to make secondary electron observation and elemental analysis with increased accuracy and sensitivity. Thus, an apparatus and a method for observing samples is provided that allows for the accurate and high-resolution internal observation of LSI devices.

4 Claims, 15 Drawing Sheets

APPARATUS AND METHOD FOR OBSERVING SAMPLE USING ELECTRON BEAM

CLAIM OF PRIORITY

This application claims priority to Japanese Patent Application No. 2001-346849 filed on Nov. 13, 2001.

BACKGROUND OF THE INVENTION

1. Field of the Invention

The present invention relates to methods and systems for the observation, analysis, and evaluation of thin film samples or fine particles, and more specifically, the present invention relates to systems and methods for analyzing, at multiple stages driving fabrication, electronic devices and/or micro devices such as semiconductor devices, liquid crystal devices, magnetic head devices, that require observation and analysis of not only surfaces of an observation subject but also inner cross sections near the surface thereof.

2. Description of the Background

As a means for obtaining information on the elemental composition of a sample, it is known to detect x-rays generated as a result of electron beam irradiation. X-rays have two components: characteristic radiations with energy specific to the elements comprising the sample, and continuous x-rays whose energy is shorter than the energy of the incident electron beam as a result of Bremsstrahlung radiation. By analyzing the energy spectrum of x-rays, it is possible to find out the elemental composition of the sample. JP-A-68060/1980 discloses a collimator having an opening, which is smaller than an x-ray detector, for taking in x-rays from a sample (Related Art 1). FIG. 21 shows a schematic view of a device that has been improved from the structure of the Related Art 1.

The improved structure works as follows. Electron beam 8 is irradiated onto a sample 22, which emits x-rays due to the irradiation. An x-ray detector 16 having an x-ray detecting element 161 provided above in a slanting direction of the sample 22, and a collimator 162 for restricting the optical path of x-rays disposed between the x-ray detecting element and the sample, detects the x-rays emitted from the sample.

FIG. 23 is a schematic enlarged view showing around the sample 22 in an in-lens electron microscope shown in FIG. 22. A micro sample 22 is introduced into a space interposed between an upper magnetic pole 707 and a lower magnetic pole 708 comprising an objective lens. A mesh 26 holds the micro sample 22, which is attached to a sample holder 706 therethrough. X-rays 401, secondary electrons 301, and reflected electrons 205 are generated as an electron beam 8 irradiates the sample 22. When the micro sample 22 is analyzed for its elemental structure by detecting x-rays thereof, it is ideal if the measured x-rays are only the x-rays 401. In actuality, however, various aspects generate x-rays as described below.

A part of the reflected electrons 205 generates x-rays 402 with an energy having no bearing on the sample itself by colliding with a surface of the upper magnetic pole 707. Transmitted electrons 201 and 202 passing through the sample 22 collides with the sample holder 706 and the lower magnetic poles 708 so as to generate X-rays 403 and 406. Reflected electrons 207 generated by the transmitted electron 202 being scattered at the lower magnetic pole 708 collide with the sample holder 706 so as to generate x-rays 407. X-rays generated by the transmitted electron 202 colliding with the lower magnetic pole are incident on the sample holder 706 so as to generate x-rays 405. Although not shown in any of the figures, there are other x-rays generated by reflected electrons and transmitted electrons colliding with other parts of the sample 22 and the mesh 26.

These reflected x-rays are called "background x-rays" because they are not generated from the sample. The background x-rays cause to deteriorate accuracy of the elemental analysis. A collimator 162 shown in FIG. 21 is provided to reduce the above-described background x-rays entering into the x-ray detecting element 161 as much as possible.

Another method for reducing the background x-rays is disclosed in "Principles of Analytical Electron Microscopy", edited by David C Joy et al., p.p. 131–135, 1986, Plenum Press, New York (Related Art 2). In this example, as shown in FIG. 24, surfaces of upper 707 and lower 708 magnetic poles have plates 501 and 502, respectively of a light elemental material having a hole for transmitting the electron beam, whereby the reflected electron 205 and transmitted electron 202 from a sample 22 collide with a light elemental plate 501, 502 rather than directly colliding with the magnetic poles 707, 708 mainly formed of Fe. In this way, the number of reflected electrons at the magnetic poles, the energy characteristics of the x-rays, and the amount of continuous x-rays are reduced, thus enabling a reduction in the background x-rays as a result thereof.

JP-A-261894/1997 discloses a method for reducing background x-rays generated by reflected electrons and transmitted electrons colliding with places other than an observation point on a sample (Related Art 3). In this method, when creating an observation surface in the form of a thin film from the sample, the observation surface is formed so as to be inclined with respect to a side face of the sample that is not made into a thin film. A carbon film covers a surface of the sample other than the observation point. There is also a method using a sample stage covered by carbon.

The above-described conventional methods have at least the following problems. The method of Related Art 1 prevents x-rays generated from a non-sample portion from entering into a detecting element by providing a collimator 162 between the x-ray detecting element 161 and the sample 22. In case of using a thin film sample, such a method is not effective with respect to x-rays generated by transmitted electrons that pass through the sample and collide with a sample stage immediately below the sample. Moreover, when a narrow collimator 162 is provided to limit x-rays only from an electron beam irradiation point on the sample 22, a distance between the detecting element 161 and the sample 22 has to be relatively long, thus lowering detection efficiency due to lack of a proper detection angle.

Furthermore, the x-ray detector 161 must be accurately placed with respect to the sample 22. Thus, displacement of the sample 22 would result in decreased detection sensitivity.

In Related Art 2, a light elemental material covers the surfaces of upper and lower magnetic poles of the objective lens. The method is effective when a transmission electron microscope that has high accelerating voltage of the electron beam and when a thin sample with a thickness equal to or less than 100 nm is used because of a decrease in the scattering of electron beams transmitted through the sample. However, when a general scanning electron microscope, or a sample with a thickness of 100 nm or more is used, the electron beam transmitted through the sample has a greater scattering angle. Thus, background x-rays due to the collision of electron beams with portions other than the parts of light elemental material covering the magnetic poles or a sample stage increase, thereby deteriorating detection accuracy.

Even in a processing method of a micro sample as shown in Related Art 3, background x-rays generated by a collision of the electron scattered as described above with portions other than a sample stage or a sample chamber are not considered. Thus, the ratio between a signal and a background noise becomes undesirable, and measurement accuracy is also lowered because x-rays from portions other than measurement positions are also detected. The x-rays generated when scattered electrons collide with a carbon film deposited on a sample would be reduced compared to the case without the carbon film, although the degree of reduction is not sufficient. The method for forming a carbon film on a part of the micro sample requires deposition equipment, and the deposition becomes necessary every time a sample is made. Thus, the production of a sample becomes increasingly complicated and requires additional time.

Where a carbon film covers a sample stage, signals from elements comprising the sample stage may be reduced, but the carbon film emits characteristic x-rays and continuous x-rays. Therefore, the signal to noise ratio cannot be greatly improved with this method.

As described above, potential problems in elemental analysis by x-rays detection are mentioned. An additional problem is that the electrons scattered by passing through the sample generate reflected electrons by colliding with other parts of the apparatus, and the reflected electrons are incident upon portions other than the measurement point of the sample so as to generate secondary electrons, thereby making it different from an original secondary electron image.

SUMMARY OF THE INVENTION

In view of the above, an object of the present invention is to provide an apparatus and a method for observing samples that is capable of making vertical cross-sectional observation of an inner cross section of a target sample, and of high-resolution, high accuracy, and high through-put observation/analysis, and moreover, to provide an apparatus and method capable of observing and analyzing a sample without failure or degradation due to an exposure to the air.

An apparatus for observing samples according to at least one embodiment is characterized in that, the apparatus comprises: an electron beam irradiating optical system having an electron source, a lens for focusing the electron beam, an electron beam scanning deflector; a sample stage upon which a sample is placed; and an electron beam detector for detecting electrons generated by the sample by irradiating the electron beam on the sample and/or an x-ray detector for detecting x-rays, in which the observation is performed by placing a piece (shielding piece) having a hole and made from at least a light elemental material to the sample stage behind the sample and by irradiating the electron beam. With this structure, the electron beam that is incident on parts other than the sample after being transmitted through a thin film sample is incident on a piece of light elemental materials, thereby reducing the number of back scattered electrons and continuous x-rays generated therefrom.

Thus, it is possible to detect the characteristic x-ray spectrum peak of the element included in the sample with a high signal to noise ratio with respect to the continuous x-ray spectrum on the background. It is also possible to reduce the influence of reflected electrons generated by the electron beam transmitting through the sample and colliding with other parts or secondary electrons and transmitted electrons generated by reentering the micro sample. It is thus possible to make a high spatial resolution observation and an accurate measurement of the secondary electrons and reflected electrons. Moreover, the sample does not have to be taken out from the apparatus, thus observation and analysis can be quickly made.

In an elemental analysis by characteristic x-ray detection when irradiating with a charged particle beam, by making a thin film of the micro sample, it is possible to decrease the x-rays generation area due to scattering of the charged particle beam in the sample. Moreover, by introducing a piece of light elemental material, it is possible to reduce x-rays generated by incidence of the electron beam on places other than the micro samples after being transmitted through the target sample, or x-rays generated by back scattered electrons from these other places reentering to the target sample, thereby enabling a high spatial resolution elemental analysis.

Thus, it is possible to provide an apparatus for observing a sample that is capable of observing and analyzing an inner cross section of the target sample with high-resolution, high accuracy, and in a short period of time.

In at least one preferred embodiment, an apparatus for observing a sample is characterized in that the apparatus includes: a focused ion beam irradiation optical system having an ion source, a lens for focusing the ion beam, and an ion beam scanning deflector; an electron bean irradiating optical system having an electron source, a lens for focusing the electron beam, and an electron beam scanning deflector; and a sample stage upon which a sample is placed. There is preferably provided a means for separating a second sample from the sample by using the focused ion beam, a manipulator for extracting the second sample, and either or both of an electron beam detector for detecting electrons generated from the sample by irradiating the electron beam to the micro sample, and/or an x-ray detector for detecting x-rays. The function includes observing the second sample by the electron beam by placing a piece (shielding piece) having a hole and made from at least a light elemental material behind the extracted second sample on the sample stage or between the sample stage and the second sample.

Accordingly, it is possible to provide a high accuracy observation with high spatial resolution as described above. In addition, it is possible to provide an apparatus for observing samples that is capable of observing and analyzing the sample in a short time period because the sample does not have to be taken out from the apparatus.

An apparatus for observing a sample may be characterized in that the manipulator for extracting the second sample separated from the introduced sample has a manipulator driver for driving the manipulator independent from the sample stage, and a function of varying an irradiation angle of a charged particle beam for observing the second sample while holding the second sample by the manipulator.

Accordingly, the sample including a portion for observation can be moved with respect to the scanning electron optical system or the focused ion beam irradiation optical system while remaining attached to the manipulator, thereby enabling the disposition of the micro sample to a place with a more favorable observation resolution. It is possible to freely select an observation orientation of an inner cross section of the target sample. Thus, it is possible to provide an apparatus for observing a sample that is capable of making high-resolution observations and high accuracy measurement and evaluation of a film thickness, an implantation status, and a shape and size of etched or planarized portion by observing the cross section perpendicularly. Because the sample does not need to be taken out from the apparatus, observation and analysis can be made rapidly.

In at least one embodiment, an apparatus for observing a sample is characterized in that a second manipulator having a light element piece on a tip thereof introduces the light element piece into a space behind the observation sample extracted and supported by the first manipulator, i.e., a space opposite from a component generating the charged particle beam for observation.

Accordingly, it is possible to reduce the influence of back scattered electrons generated by an electron beam incident on portions other than the sample after being transmitted through the sample, thereby enabling to make high-resolution observation. Moreover, because the sample does not have to be taken out from the apparatus, observation and analysis can be made in a reduced time period.

In an elemental analysis by characteristic x-ray detection while irradiating the charged particle beam, by making a thin film of the micro sample, it is possible to decrease the x-ray generation area due to scattering of the charged particle beam in the sample. Moreover, by introducing a piece of light elemental material, it is possible to reduce x-rays generated by incidence of the electron beam on places other than the micro samples after transmitting through the target sample, or x-rays generated by back scattered electrons from these other places returning to the target sample, thereby enabling a high spatial resolution elemental analysis.

An apparatus for observing samples according to an additional aspect of the invention is characterized in that the apparatus includes a second sample stage having a light element piece of a first aspect attached to the sample stage. The sample to be observed is placed proximate to the light element piece.

Accordingly, a high-resolution observation is achieved by the above-described reasons, and a rapid observation and analysis are also possible. By fixing the extracted sample to a part of the second sample stage, it is possible to avoid the effects of vibration during the sample observation.

An apparatus for observing samples according to an additional aspect is characterized in that the apparatus includes a third sample stage having a function for varying irradiation position and angle of charged beam for observation for the sample. The apparatus preferably includes a light element piece that is driven independently from the sample stage of the first aspect and places a sample including an observation target extracted from the sample.

Accordingly, it is possible to provide an apparatus for observing samples that is capable of observing and analyzing a target inner cross section of the sample with a high-resolution in a short period of time. A plurality of samples can be fixed on the second sample stage by one manipulator by separating the extracted sample from the manipulator, such that time for cross-sectional observation and elemental analysis is decreased. Moreover, because the sample is fixed on the second sample stage by being separated from the manipulator, it is possible to avoid any vibration problem during sample observation.

An additional apparatus for observing samples is characterized in that the shielding piece according to the above aspects includes a hole, and is placed immediately behind the sample. The ratio of the distance between the sample and an upper surface of the hole to the diameter of the hole is preferably no more than $1/5$.

Accordingly, the electron beam transmitting through the sample is made incident on the hole of the light element piece, and the incident electron collides with a side and bottom of the hole. The majority of the electrons are scattered toward the hole bottom as they collides with the side surface, thus enabling a significant reduction in the number of electrons returning to the surface. Moreover, x-rays generated by the collision of elections inside the hole and incident to the hole after being transmitted through the sample reaches the x-ray detector after passing though the light element piece. Because the x-rays decay as they pass, it is possible to reduce the influence of x-rays generated in the hole. Accordingly, it is possible to provide an apparatus for observing samples that is capable of making accurate and high-resolution observations.

An additional apparatus for observing samples is characterized in that a heavy elemental material covers the shielding piece having the above-described hole. Accordingly, x-rays generated by collisions inside the hole after being transmitted through the sample decay in the shielding piece of the light elemental material, and further decay in the heavy elemental material having stronger decaying ability that covers outside of the shielding piece, thereby enabling a reduction in x-rays generated in the hole that would be detected by the x-ray detector. Thus, it is possible to provide an apparatus for observing samples that is capable of making accurate and high-resolution observation.

An additional apparatus for observing samples is characterized in that the light element piece is formed of beryllium, carbon or a compound of carbon and beryllium. Generally, when electrons collide with a substance of a certain element, x-rays called "characteristic x-rays" specific to the element of the substance and continuous x-rays, i.e., Bremsstrahlung radiations, are generated. The characteristic x-rays are observed as a spectrum peak so that information about the element contained in the sample can be obtained from the peak. Therefore, such a peak should not be generated from portions other than an observation target of the sample. As described above, in the present invention, an electron beam transmitting through the thin film sample is preferably incident into a hole of a light elemental material located immediately behind the thin film sample so as to generate x-rays inside the hole. If the energy of the x-rays is reduced, it is more likely that the x-rays are absorbed and decayed in the substance. Therefore, by comprising the piece of a light element, such as beryllium or carbon, background x-rays can be reduced greatly. The energy of the x-rays of beryllium is 110 eV, which is not detectable with a conventional semiconductor detector; thus, it is desirable to use the beryllium.

Compared to the case where the electron collides with a wafer comprised mainly of silicon or a piece made of metal material comprising a sample holder, continuous x-rays generated from a substance made of beryllium or carbon by the electron collision after transmitting the sample therewith is less than $1/5$ this amount. It is thus possible to reduce continuous x-rays, and the number of reflected electrons can also be reduced. Accordingly, it is possible to provide an apparatus for observing samples with a high-resolution and high accuracy.

An additional apparatus for observing samples is characterized in that a thickness of the light element piece is thicker than a depth of penetration of the electron beam. Accordingly, the electron beam transmitted through the sample does not transmit through the light element piece, but is absorbed thereby. Therefore, it is possible to provide an apparatus for observing samples that is capable of making observation with high-resolution and accuracy.

An additional apparatus for observing samples is characterized in that the light element piece is grounded.

Accordingly, the light element piece is not charged, thereby enabling an apparatus for observing samples that is capable of making observations with high-resolution and accuracy.

A method for observing samples with an apparatus is characterized in that, the apparatus includes: an electron beam irradiating optical system having an electron source, a lens for focusing the electron beam, an electron beam scanning deflector; a sample stage for placing a sample; and a detector for detecting x-rays and electrons generated from the sample by irradiating the electron beam to the sample. The sample is observed by irradiating the electron beam while setting a piece (shielding piece) that at least includes a light elemental material behind the sample. Accordingly, it is possible to reduce the influence of x-rays and back scattered electrons generated by the electron beam transmitting through the sample that are incident on portions other than the sample. Thus, it is possible to provide a method for observing samples that can observe and analyze samples accurately and with greater sensitivity.

Moreover, a method for observing samples with an apparatus is characterized in that, the apparatus includes: a focused ion beam irradiation optical system having an ion source, a lens for focusing the ion beam, and an ion beam scanning deflector; an electron beam irradiating optical system having an electron source, a lens for focusing the electron beam, and an electron beam scanning deflector; and a sample stage upon which a sample is placed. The observing method includes a function for separating a second sample from the sample by using the focused ion beam, a manipulator for extracting the second sample, a detector for detecting x-rays and electrons generated from the second sample by irradiating the electron beam to the micro sample, and for observing the second sample by the electron beam while setting a piece (shielding piece) made from at least a light elemental material behind the extracted second sample.

Accordingly, it is possible to freely align an observation surface of the sample extracted with respect to the direction of the electron beam for observation without exposing the sample to the air, and to reduce an influence of x-rays and back scattered electrons generated by the electrons transmitted through the sample colliding with portions other than the sample. Thus, it is possible to provide a method for observing samples that can observe and analyze an inner cross section of the sample with high-resolution and in a short period of time. In particular, by applying the method to the semiconductor wafer, it can be used for a process check at various stage of semiconductor production, thereby contributing to improved yield percentages of production by quick quality control and early detection of device defects.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

First Exemplary Embodiment

Figure 1:
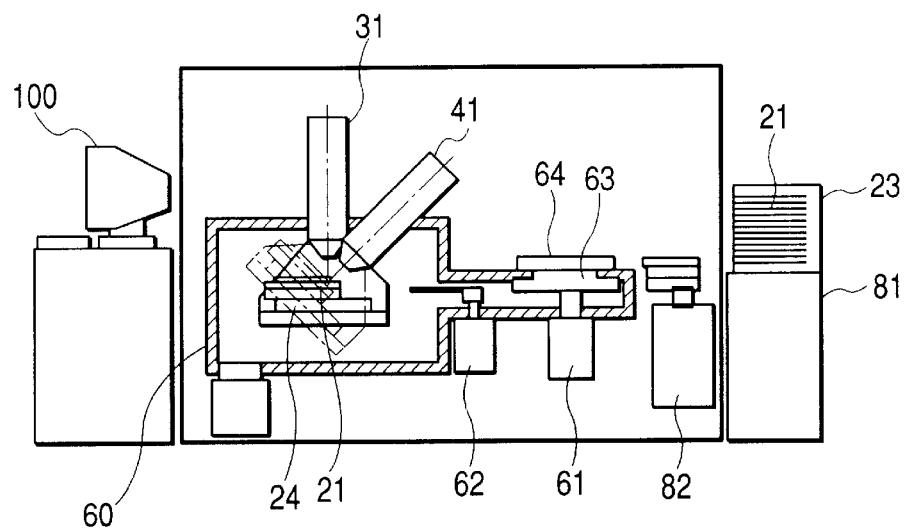
FIG. 1 is a block diagram showing an overall apparatus according to a first exemplary embodiment of the present invention.
Figure 2:
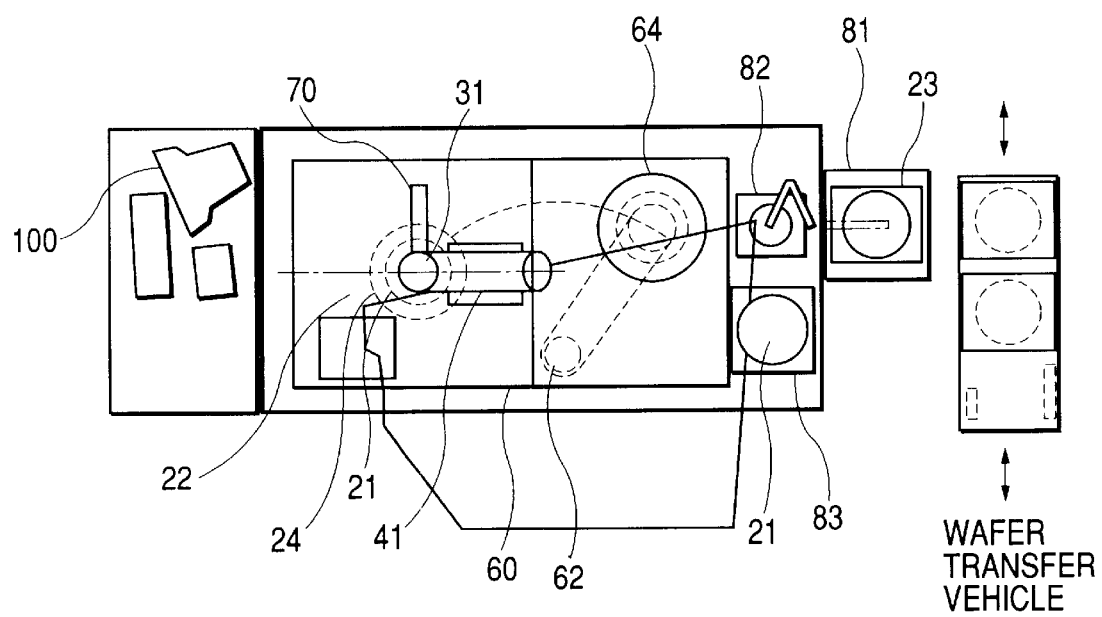
FIG. 2 is a plan view showing an overall structure of an apparatus according to a first exemplary embodiment of the present invention.
Figure 3:
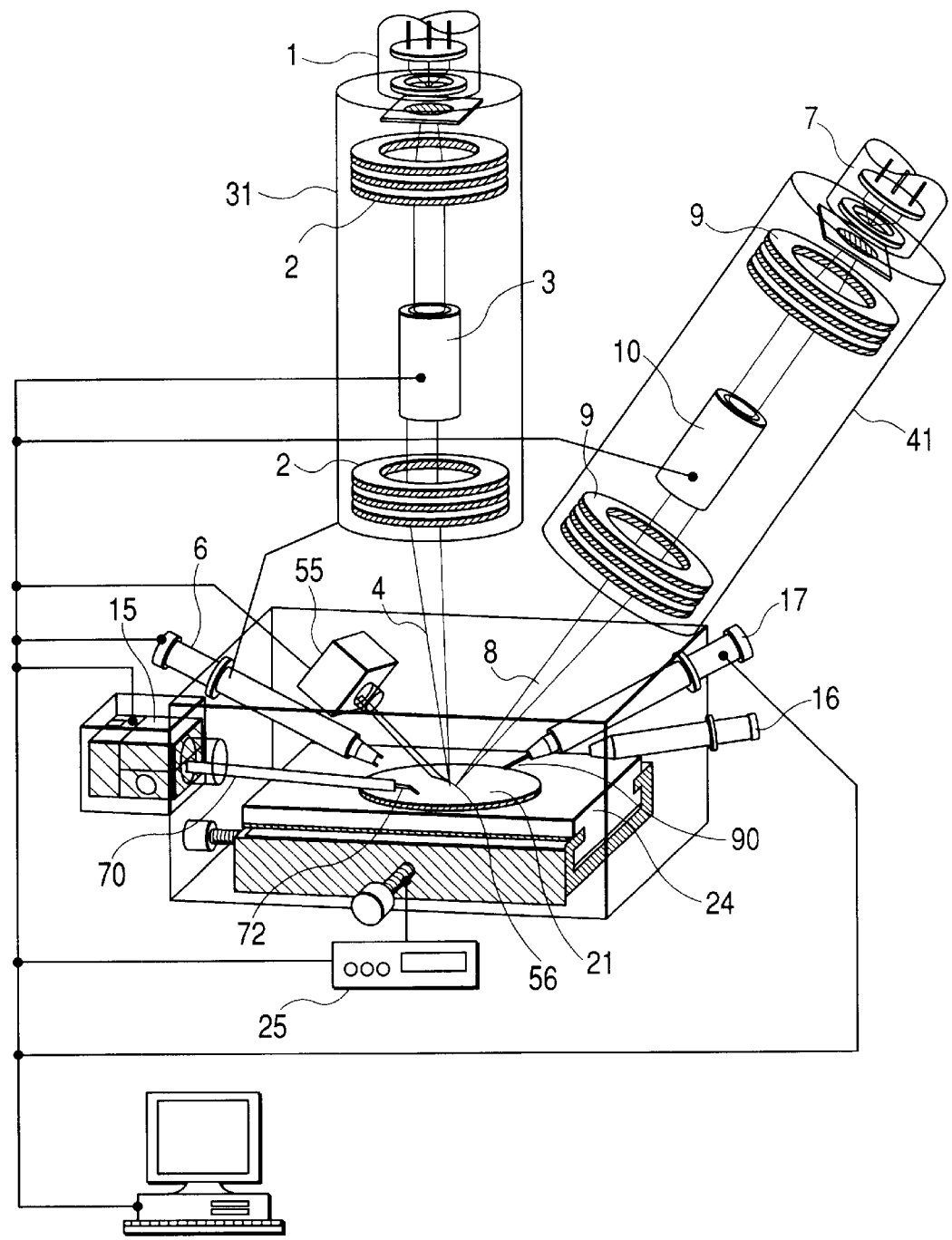
FIG. 3 is a detailed block diagram of an apparatus according to a first exemplary embodiment of the present invention.

An apparatus structure and operation according to a first exemplary embodiment will be described with reference to FIGS. 1 to 6. FIGS. 1 and 2 show an overall structure of the apparatus; FIG. 3 shows detailed structures of a focused ion beam irradiation optical system, a scanning electron optical system, and a circumference of a sample stage. The embodiment shows a wafer-compatible apparatus as an apparatus for observing samples according to the present invention. FIG. 3 is a schematic overhead cross-sectional view of FIG. 1. FIG. 1 and FIG. 3 show different orientations of the apparatus, or some details thereof, for convenience of description, but these are essentially the same devices.

In FIG. 1, in the center of the apparatus system, a vacuum sample chamber 60 includes a focused ion beam irradiation optical system 31 and an electron beam irradiating optical system 41 placed on the top thereof. The vacuum sample chamber 60 has a sample stage 24 for placing a wafer 21 as a sample inside. Two column irradiating optical systems 31 and 41 have respective central axes adjusted to intersect at one point near the surface of the wafer 21. The sample stage 24 includes a mechanism for accurately moving the wafer 21 in any direction which is controlled in such a manner that a specific portion of the wafer 21 is placed directly below the focused ion beam irradiation optical system 31. The sample stage 24 also has the function of rotating, translating up and down, and inclining.

An evacuation system (not shown) is connected to the vacuum sample chamber 60 so as to adequately maintain a vacuum. The irradiating optical systems 31 and 41 also have separate evacuation systems (not shown) so as to adequately maintain a vacuum. The vacuum sample chamber 60 further includes a wafer introduction unit 61 and a wafer transferring unit 62 therein. Adjacent to the vacuum sample chamber 60, a wafer transfer robot 82 and a cassette introduction unit 81 are disposed. The vacuum sample chamber 60 has an operation controller 100 provided for controlling and managing a series of processes of the overall apparatus including sample processing, observation, and evaluation.

A wafer introduction operation of the present embodiment will now be outlined. When the operation controller 100 generates an operation initiating command with a wafer cassette 23 being placed on a table of the cassette introduction unit 81, the wafer transfer robot 82 retrieves a wafer to be used as a sample from a designated slot within the cassette. An orientation alignment unit 83, shown in FIG. 2, then adjusts the orientation of the wafer 21 in a predetermined position. The wafer transfer robot 82 puts the wafer 21 on a mounting stage 63 when a hatch 64 on top of the wafer introduction unit 61 opens. When the hatch 64 closes, a narrow space formed around the wafer becomes a load lock chamber, and an evacuating means (not shown) exhausts air therefrom, thereby descending the mounting stage 63. Thereafter, the wafer transferring unit 62 picks up the wafer 21 on the mounting stage 63, and places it on the sample stage 24 in the vacuum sample chamber 60. As a bend correction or vibration prevention of the wafer 21, the sample stage 24 may have a chuck to fix the wafer 21 if required. The operation controller 100 moves the sample stage 24 according to coordinate value information of an observation analysis position on the wafer 21 so as to stop the observation analysis position of the wafer 21 directly below the focused ion beam irradiation optical system 31.

Figure 7A:
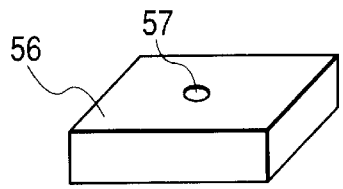
FIG. 7 is a detailed view of a light element piece of the present invention.
Figure 7B:
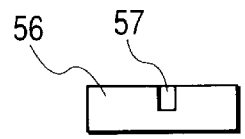

Next, with reference to FIG. 3, a method for processing, observation, and evaluation of a sample will be described. In the apparatus for observing samples according to the present invention, the focused ion beam irradiation optical system 31 comprises an ion source 1, a lens 2 for focusing an ion beam emitted from the ion source 1, an ion beam scanning deflector 3 and similar elements. The electron beam irradiating optical system 41 comprises an electron source 7, an electron beam lens 9 for focusing the electron beam 8 emitted from the electron source 7, and an electron beam scanning deflector 10. Also, the following elements are preferably included: a secondary particle detector 6 for detecting a secondary particle from the wafer 21 being irradiated by the focused ion beam (FIB) 4 or the electron beam 8; a movable sample stage 24 for placing the wafer 21 thereon; a sample stage controller 25 for controlling a position of the sample stage to specify a desirable sample position; a manipulator driver 15 for controlling the optimal position and direction of a specific position of the micro sample when observing and evaluating the sample by moving a probe 72 on a tip of a manipulator 70 to an extraction position of the micro sample, extracting it, and irradiating the focused ion beam (FIB) 4 or the electron beam 8 thereto; an x-ray detector 16 for detecting x-rays emitted when irradiating the electron beam 8; a deposition gas supplying source 17 for fixing the micro sample to the probe 72; and a light element piece introducing unit 55 having a piece 56 made of a light elemental material on a tip thereof. The size of the light element piece 56 is preferably approximately 5 mm long, 2 mm wide, and 2.5 mm thick. As shown in FIG. 7, the light element piece 56 preferably has a hole 57. An exemplary diameter of the hole may be 1 mm, and a depth thereof is 2 mm.

A procedure for a sample processing, observation, and evaluation after introduction of the wafer in the embodiment will now be outlined. Initially, the sample stage is lowered, and a tip of the probe 72 is separated from the wafer 21. Under such a position, the probe 72 moves in a horizontal direction (x-y direction) with respect to the sample stage 24 so as to set the tip of the probe 72 to the scanning area of the FIB 4. The manipulator driver 15 stores the position coordinate, and draws back the probe 72.

Figure 4:
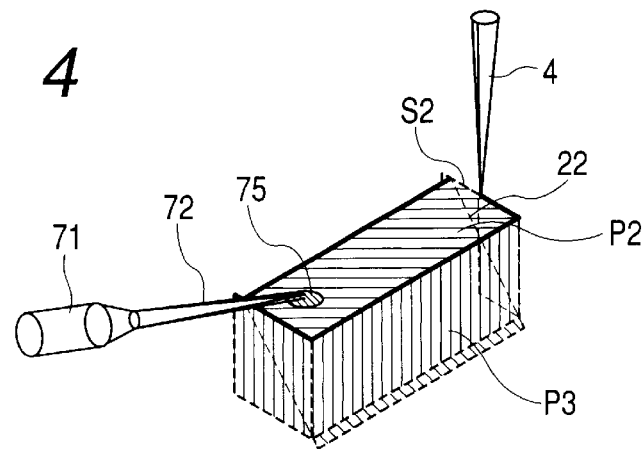
FIG. 4 is a diagram showing an example of a method for processing a micro sample according to the present invention.

The focused ion beam irradiation optical system 31 irradiates the FIB 4 to the wafer 21 so as to form a groove in such a manner that the groove is in a horseshoe shape crossing over an observation analysis face p2 as shown in FIG. 4. The processing area is about 5 $\mu$m long, 1 $\mu$m wide, and 3 $\mu$m deep, and one side thereof connects to the wafer 21. Thereafter, the sample stage 24 is inclined and processed by the FIB 4 to form a slanted surface of a triangular prism. At this time, a residual area S2 connects the micro sample 22 and the wafer 21. After the tilted sample stage 24 is returned to the original position, the probe 72 on a tip of the manipulator 70 comes in contact with an end portion of the micro sample 22, and the deposition gas supplying source 17 (FIG. 3) irradiates on a contact point 75, and forms a deposition film on the contact point 75 due to irradiation of the FIB 4 so as to integrate the probe 72 and the micro sample 22 by bonding.

Figure 5C:
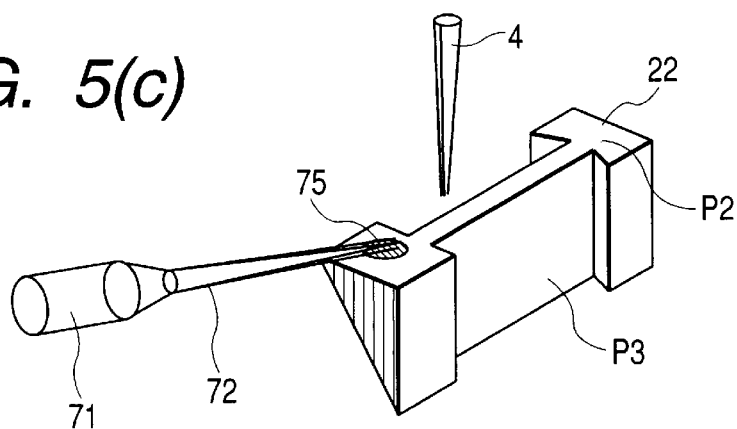
FIG. 5 is a diagram showing an example of a method for observing a micro sample according to the present invention.
Figure 5B:
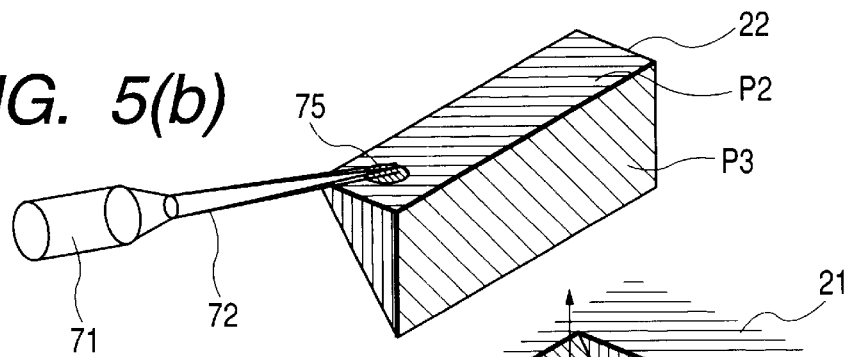
Figure 5A:
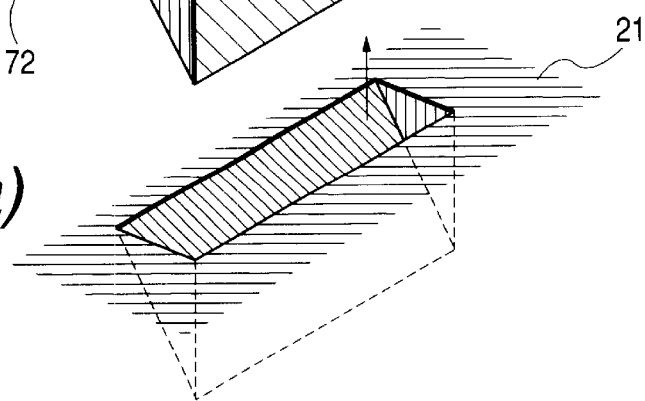

Next, the FIB 4 cuts the residual area S2 to detach the micro sample 22. The probe 72 now supports the micro sample 22, thereby completing a preparation for retrieving a surface and inner cross section for the observation/analysis purposes as an observation analysis face p3 of the micro sample 22. In FIG. 4, reference numeral 71 denotes a probe holder for holding the probe 72 at the manipulator 70. Thereafter, as shown in FIG. 5B, the manipulator 70 upholds the micro sample 22 from the surface of the wafer 21. If required, as shown in FIG. 5C, the FIB 4 may be irradiated to the micro sample 22 while being supported by the probe 72 so as to form an observation cross section P3 having a desirable thickness by appropriately processing.

Figure 6:
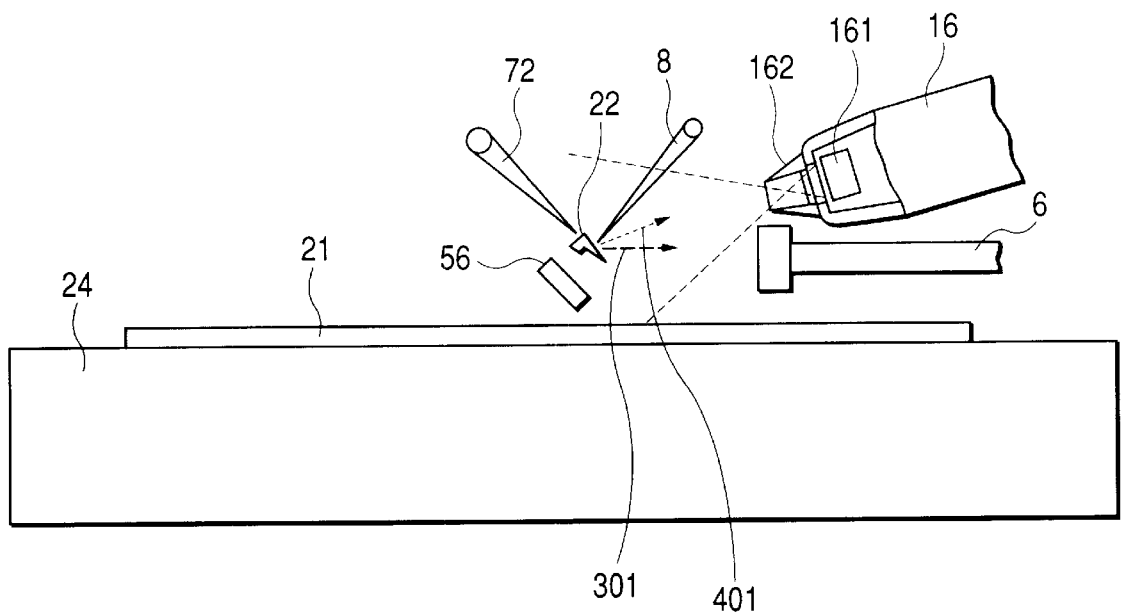
FIG. 6 is a detailed block diagram according to a first exemplary embodiment of the present invention.

Next, as shown in FIG. 6, the micro sample 22 is rotated, and by moving the manipulator 70, the position of the micro sample 22 is controlled for standing so that the electron beam 8 of the electron beam irradiating optical system 41 is incident upon the observation cross section P3 generally perpendicularly. As shown in FIG. 6, the light element piece introduction unit (55 not shown) moves the light element piece 56 of carbon relative to a position between the probe 72 on the tip of the manipulator 70 and the sample stage 24 so as to introduce it into a space opposite to a surface where the electron beam 8 is incident. At that time, the sample should be placed near the center of an upper surface of the hole provided to the light element piece. A distance between the micro sample 22 and the upper surface of the hole is preferably set to be about 0.1 mm.

When the electron beam 8 is incident upon the micro sample 22, a surface of the micro sample 22 generates secondary electrons 301 reflecting an inner structure and a surface shape thereof. Also, it generates x-rays 401 including characteristic x-rays specific to an elemental composition of the incident portion. By detecting the x-rays 401 and analyzing the energy distribution thereof, it is possible to find out the elemental composition of a portion where the electron beam is irradiated (i.e., spot elemental analysis). The electron beam 8 scans over an observation analysis surface of the micro sample 22 in one direction or a two-dimensional direction. By detecting the secondary electrons and the x-rays by the secondary electron detector 6 and the x-ray detector 16, respectively, a shape of the observation analysis surface and the elemental composition distribution (elemental line analysis or mapping analysis) are observed.

Figure 8A:
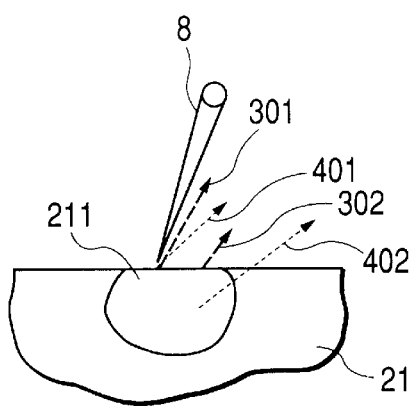
FIG. 8 is a schematic view showing a principle of the present invention.
Figure 8B:
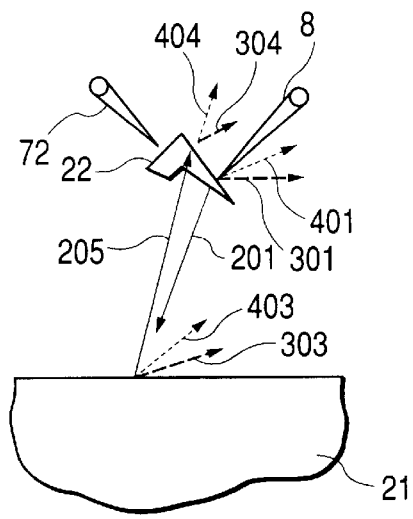
Figure 8C:
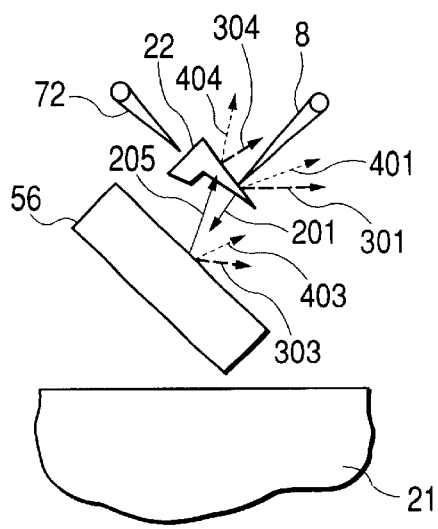
Figure 8D:
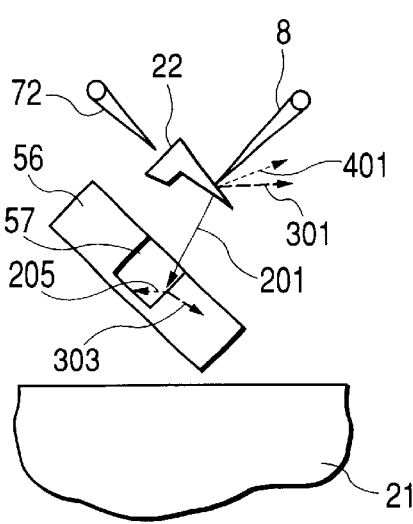

FIGS. 8A to 8D are diagrams illustrating effects of the light element piece 56 in the present embodiment. FIG. 8A shows a conventional observation method; FIG. 8B shows a case of observing a micro sample without the light element piece introduced thereto; and FIGS. 8C and 8D shows cases where the light element piece 56 according to the present invention is introduced thereto.

In the exemplary description below, an acceleration voltage of the electron beam 8 is 15 kV, the sample 21 is a silicon wafer, a main component of the sample 21 and the micro sample 22 is silicon, and a thickness of the micro sample 22 along an incident direction of the electron beam 8 is 0.1 $\mu$m. When the electron beam 8 is incident on the micro sample 22, about 95% of the electrons transmit through the micro sample 22. Reference numeral 201 in FIGS. 8B, 8C, and 8D show examples of these transmitted electrons. The scattered angle of the transmitted electrons is about 40 degrees by full angle. The transmitted electrons 201 shown in figures is only exemplary, and not all transmitted electron travel according to the track shown.

When the light element piece is not introduced as shown in FIG. 8B, the electrons 201 transmitting through the micro sample 22 is incident on the silicon wafer 21. The incident electrons 201 scatter in the silicon wafer, and again come out from a surface of the silicon wafer as shown as electron 205. Such an electron is referred to as a back scattered electron. With this process, secondary electrons 303 and the x-rays 403 are generated from the silicon wafer surface. About 20% of the incident electrons are scattered to the back by vertical incidence (i.e., when the incidence angle is 0 degrees), and about 40% thereof are scattered by a 60-degree incidence angle. The back scattered electrons 205 are again incident on the micro sample 22, thereby generating the secondary electrons 304 and the x-rays 404 at points other than the incidence point of the electron beam 8.

The secondary electron detector 6 shown in FIG. 6 detects almost all secondary electrons not only from the measurement sample, but also from an area in the vicinity of the sample, i.e., it detects not only the secondary electrons 301 generated at the micro sample surface, but also the secondary electrons 303 generated by the transmitted electrons and the secondary electrons 304 generated by the back scattered electron. For a high-resolution observation, having fewer secondary electrons of the above-described types is more preferable.

Hereinbelow, x-ray detection will be described. FIG. 6 shows a conventional semiconductor x-ray detector 16. The x-ray detector 16 has on a tip thereof a collimator 162 attached thereto having an inner surface following a part of a side face of a cone comprised of a detection surface of an x-ray detecting element 161 and a irradiation point on the micro sample of the electron beam 8. However, it detects x-rays generated in a space shown between the two dotted lines in FIG. 6. Accordingly, it also detects x-rays 403 and 404 generated at a portion other than the irradiation point of the electron beam 8 on the micro sample 22 as shown in FIG. 8B. Thus, it detects not only a signal from the micro sample of an observation point, but also a signal from the silicon wafer which is an introduced sample below the micro sample, whereby results obtained from actual measurement are generally the same as an x-ray spectrum that can be obtained by irradiating the electron beam directly onto the silicon wafer. In addition, the raw materials for the micro sample and the introduced sample are both silicon, and thus, the x-ray spectrum appears with characteristic x-rays of Si from the micro sample overlapping characteristic x-rays of Si from the introduced sample. It has heretofore been impossible to separate these two components. Accordingly, it has been impossible for the above-described structure to allow for accurate and highly sensitive measurements of the elemental composition of the micro sample.

FIG. 8C shows a method in which the light element piece 56 without a hole on a surface thereof is introduced between the micro sample 22 and the sample 21. In this method, an electron transmitting through the micro sample 22 is incident on the light element piece 56 of carbon. A material made of carbon has a lower rate of back scattering than a material made of silicon. A rate of back scattering is about 6% under a perpendicular incidence (i.e., when an incidence angle is 0 degrees), and about 27% under a 60 degree incidence angle. Thus, comparing to a silicon wafer as an introduction sample, the rate of back scattering is lowered to ⅓ or less.

Due to the electrons 201 transmitting through the micro sample, the carbon piece generates the characteristic x-rays 403 specific to a carbon atom. A signal detected by the x-ray detecting element may be discriminated for each particular x-ray energy, thus enabling to distinguish it from x-rays from silicon of the micro sample. It is possible to reduce the number of back scattered electrons from the carbon piece than the number of back scattered electrons from the silicon wafer, and therefore, it is possible to reduce the secondary electrons 304 and the x-rays 404 generated due to the back scattered electrons 205 returning to the micro sample 22. However, although continuous x-rays of Bremsstrahlung radiation generated by the carbon piece become generally ⅕ of the continuous x-rays generated from the silicon wafer in terms of integral strength, the continuous x-ray (background) strength in the energy range of 1 to 3 keV appears in the characteristic x-ray peak of Si decreases slightly. Thus, it does not appear possible to improve the sensitivity of this element generating the characteristic x-rays in the energy range.

FIG. 8D illustrates a method according to the present invention, wherein a light element piece 56 having a hole provided between the micro sample 22 and the sample 21 is introduced, whereby almost all electrons transmitting through the micro sample 22 are incident inside the hole 57 of the light element piece 56 comprised mainly of carbon. When the transmitted electron 201 collides with side and bottom surfaces of the hole 57, reflected electrons 403 or x-rays 303 are generated as described above. Many of the reflected electrons are emitted to a direction of reflection with respect to the incident electrons. Thus, many of the reflected electrons are absorbed in the hole 57 such that fewer electrons are able to exit from the hole. Thereby the number of reflected electrons that are re-incident on the micro sample 22 is significantly fewer than what is shown in FIG. 8C.

As an example, when an electron beam with an acceleration voltage of 15 kV irradiates a light element piece comprised of carbon, the electron beam goes into as deep as 2.6 μm. A bottom thickness of the hole in the embodiment is 0.2 mm, and therefore, the electron beam does not penetrate through the carbon piece. A side portion of the light element piece 56 absorbs some of x-rays 303 generated in the hole, thus reducing the x-rays reaching the x-ray detector. It is thus possible to reduce the chance that x-rays generated from portions other than the observation portion of the micro sample are detected. The carbon piece may be grounded to prevent electrical charging of the carbon piece. As a result, there is less background noise, thus enabling the analysis of an element accurately under high signal to noise ratio. Thus, it is possible to make high-resolution and high accuracy observation of the micro sample 22.

Figure 25:
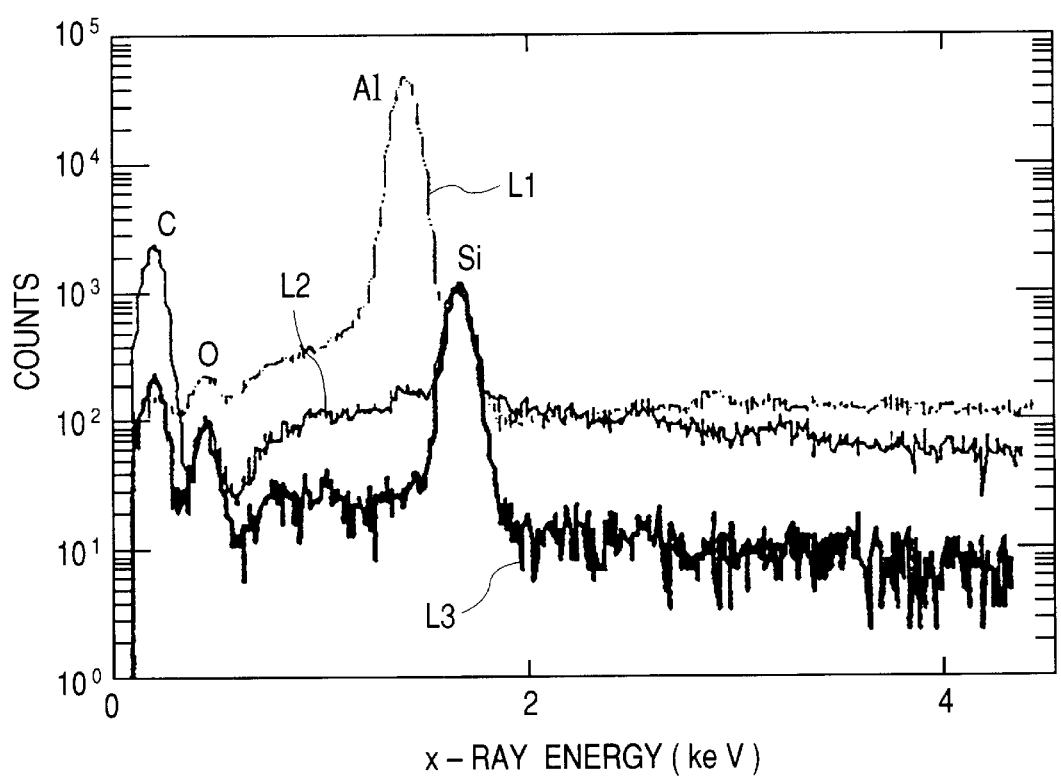
FIG. 25 depicts an x-ray spectra showing effects of the present invention.

FIG. 25 shows an x-ray spectra indicating the above-described effect according to the present invention. In order to make the effect apparent, an Al plate is placed instead of an Si wafer. Also, as a micro sample, a sample taken from the Si wafer made into a form of thin film with a thickness of 0.15 μm is used. The result is obtained by accumulating x-rays for 100 seconds generated by irradiating the micro sample with an electron beam of an accelerating voltage of 25 kV and beam current of about 1 nA.

The dotted-lined curve is a spectrum corresponding in FIG. 8D, which shows four peaks of characteristic x-rays on a continuous x-rays signal. Other than the characteristic x-ray peak generated by Si as a raw material of the micro sample, the spectrum shows a large peak of an Al characteristic x-rays from the Al plate placed beneath. Other than the two peaks described above, the characteristic x-ray peak of oxygen and carbon elements are also shown. These result from hydrocarbon adhered on a surface, an oxidized film on the Al plate, and the micro sample. An amount of the continuous x-rays is larger than a ratio of the characteristic x-ray peak of Si and the continuous x-rays in a case of using Si alone because it is possible that the continuous x-rays from the Al plate overlap with each other. As such, with a structure shown in FIG. 8B, a large peak of the Al characteristic x-rays from the Al plate as a substrate overlaps with the continuous x-rays, thus deteriorating the signal to noise ratio of the characteristic x-ray peak from Si of the micro sample. When the substrate is an Si wafer, Si peak from the micro sample and Si peak from the substrate overlaps, and it becomes impossible to separate the two components.

Next, a curve L2 in a narrow solid line is a spectrum corresponding to FIG. 8C, which is obtained by introducing a carbon board between a micro sample having Si as its raw material and an Al plate. By introducing the carbon board, a Al peak from the Al plate is hardly observed, but a peak of carbon becomes larger. An electron colliding with the Al plate after transmitting the micro sample collides further with the carbon board, thus increasing the peak of the characteristic x-rays of carbon. From the result obtained under the above-described experiment conditions, most of electrons irradiating the micro sample transmit through the micro sample. On the other hand, the total amount of signal of the continuous x-rays is reduced, but energy from the characteristic x-rays of Si does not change much compared with a case prior to introduction of the carbon board. Accordingly, it becomes easy to identify a peak of Si as it is not overlapped by the peak of Al, but a ratio to the continuous x-rays (signal to noise ratio) has not been significantly improved.

A curve L3 shown in a thick solid line shows a spectrum corresponding to FIG. 8C, which is obtained by introducing a carbon board having a hole therein between a micro sample of Si as a raw material thereof and an Al plate. An exemplary diameter of the hole is 1 mm and the depth thereof it 2 mm. The hole, is not a through-hole and a thickness of a hole bottom is 0.5 mm. The hole is provided 0.1 mm below the micro sample such that the opening of the hole comes generally at the center thereof. According to the structure, the continuous x-rays are significantly reduced, and the characteristic x-rays of carbon are also reduced. Thus, high sensitivity detection of a peak of the characteristic x-rays of Si may be achieved.

FIG. 8A shows the generation of secondary electrons when observing a thick sample such as an uppermost surface of a wafer instead of a micro sample. The electron beam 8 is incident on the uppermost surface of the wafer, and the incident beam scatters in the wafer to diffuse in an area 211 having a radius of about 1 μm so that a part of the beam is absorbed therein while another part is back scattered. Only the secondary electrons generated in the above-described diffusion area in the depth of several nm from the uppermost surface are generated from the surface and are detected by a secondary particle detector. Specifically, the secondary electrons to be detected are a sum of the secondary electrons 301 from the irradiation point of the electron beam 8 and the secondary electrons 302 due to the back-scattered electron. Because x-rays have a strong transmitting force, the x-rays 402 generated in the above-described diffusion area reaches the wafer surface. Accordingly, under the observation condition described above, spatial resolution of the elemental analysis by the x-rays is several micrometers. Moreover, when attempting the detection of a different element from a raw material element in the area within 1 μm or less, x-rays from a portion spreading in several μm is also contained, thus reducing the signal to noise ratio, thereby making the high sensitive detection more difficult.

On the contrary, the thickness of a micro sample is preferably processed to be about 0.1 μm in this embodiment. Therefore, the electron beam 8 scatters only to a thickness thereof in the micro sample, and only a few electrons are back scattered in the micro sample. Therefore, the secondary electrons generate more at the irradiation point, thus enabling a high-resolution observation. Moreover, x-rays are only generated in the diffusion area of the electron beam, and thus, the spatial resolution of the secondary elemental analysis by the x-rays detection is improved to approximately 0.1 μm.

Furthermore, an angle of the observation analysis surface P3 may be adjusted to the desirable angle. Thus, a detection efficiency of the secondary electrons at the secondary electron detector 6 becomes the same as observing the uppermost surface of the wafer, thereby making the observation condition of the surface P3 of the micro sample 22 desirable. Thus, it becomes possible to avoid a decrease of the resolution as in the conventional examples, and to make more precise observations and analysis. The observation and analysis is preferably made while the micro sample 22 is placed in the vacuum atmosphere sample chamber instead of taking the sample out therefrom, thereby avoiding contamination or attachment of foreign substance caused by exposing the inner cross section of the target sample to the atmosphere. Thus, the observation and analysis of high-resolution, high accuracy, and the optimum angle are possible. Moreover, high efficiency observation and analysis, i.e., observing and analyzing two to three portions per hour, is now possible.

In the present embodiment, a vertically processed hole is used as an example, but the structure of the hole is not limited thereto, and as long as the incident electron is not re-emitted from a hole, a hole of any shape may be used.

Figure 9:
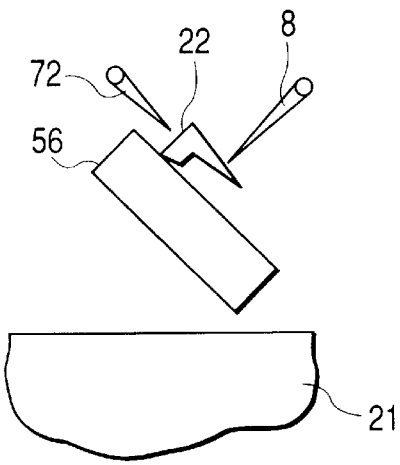
FIG. 9 is a schematic view showing another application of a first exemplary embodiment according to the present invention.

It should be noted that when the micro sample 22 is suspended in the probe 72, the micro sample 22 becomes vulnerable to vibration. When making observations and analysis under a setting environment of high magnification or vibration, the micro sample 22 may land on the light element piece 56 as shown in FIG. 9 to reduce the vibration, thereby enabling a desirable observation and analysis.

Figure 10C:
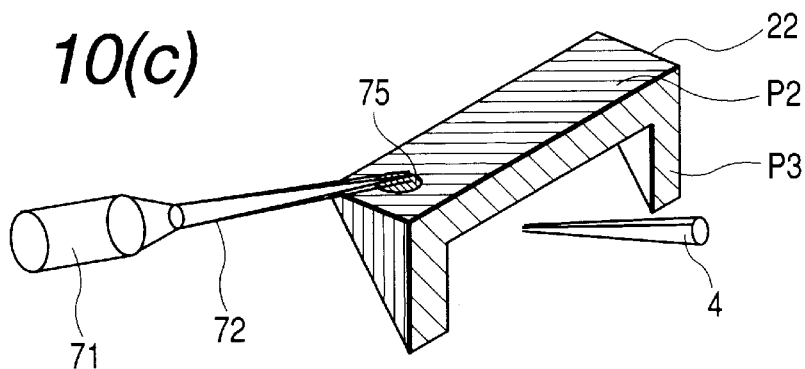
FIG. 10 is a schematic view illustrating another application of a first exemplary embodiment according to the present invention.
Figure 10B:
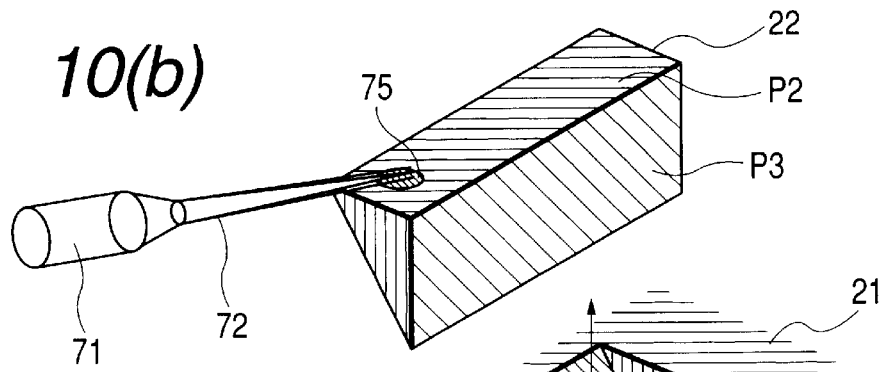
Figure 10A:
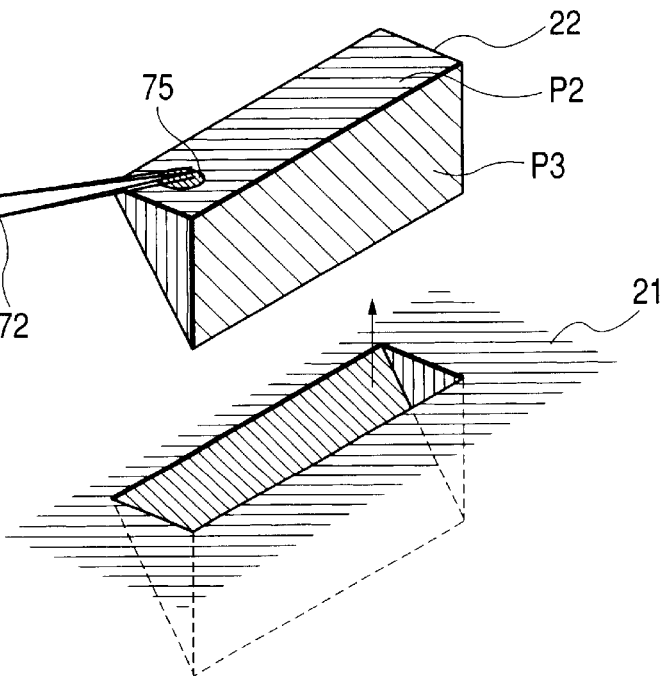

Thus far, the observation of the cross section P3 in the silicon wafer has been described. When a portion P2 of the silicon surface is to be observed, the electron beam 8 only needs to scan the observation analysis surface P2 as shown in FIG. 10. In this case, a thin film is deposited on an opposite side in a direction of the surface P2. A case may be shown where a foreign substance is observed on a surface of a silicon wafer as observed by a secondary electron image on the silicon wafer surface. In this case, when the elemental component is examined by x-ray observation, the component of the foreign substance could not be analyzed because it is submerged in the x-ray signal from the silicon wafer substrate due to a thin thickness thereof. In the present embodiment, a thin film deposited micro sample is observed, thereby reducing a signal from a base material of the foreign substance on a surface. Thus it is possible to improve the sensitivity to a component of a foreign substance on the surface by single digit.

In the above description, carbon was used as a material of the light element piece. Alternatively, beryllium or a compound of beryllium and carbon may be used. When the light element piece is made from beryllium, x-rays generated due to the electron through the micro sample colliding with beryllium have the energy specific to beryllium. However, a range of the energy specific to beryllium is smaller than energy detectable by the conventional x-ray detector, and thus, beryllium is advantageous because it does not appear in the x-ray spectrum. Moreover, when a compound of carbon and beryllium is used, two kinds of spectrum are observed: one is obtained when the electron beam transmitting the micro sample is incident on the light element piece; and another incident on beryllium. By observing them, a generation factor of a peak by carbon appeared in the spectrum, that is, either from the micro sample or from the light element piece, can be analyzed.

In the present embodiment, a hole provided to the light element piece is a cylindrical hole, but the cylindrical shape is not essential. It is only essential that the electron beam transmitting the micro sample enters into the hole. Therefore, a shape of the hole is not limited to any specific shape.

In summary, there is provided a method for observing a sample with an apparatus for observing samples, the apparatus including: an electron beam irradiating optical system having an electron source, a lens for focusing electron beam, an electron beam scanning deflector; a sample stage for placing a sample; and a detector for detecting x-rays and electrons generated from the sample by irradiating the electron beam to the sample, in which the sample is observed by irradiating the electron beam while setting a piece (shielding piece) that at least includes a light elemental material behind the sample.

Moreover, there is provided a method for observing a sample with an apparatus for observing samples, the apparatus including: a focused ion beam irradiation optical system having an ion source, a lens for focusing the ion beam, and an ion beam scanning deflector; an electron beam irradiating optical system having an electron source, a lens for focusing the electron beam, and an electron beam scanning deflector; and a sample stage for placing a sample, in which, the observing method includes separating a second sample from the sample by using the focused ion beam, extracting the second sample using a manipulator, detecting x-rays and electrons generated from the second sample by irradiating the electron beam to the micro sample, and observing the second sample by the electron beam while setting a piece (shielding piece) including at least a light elemental material behind the extracted second sample.

Second Exemplary Embodiment

Figure 11:
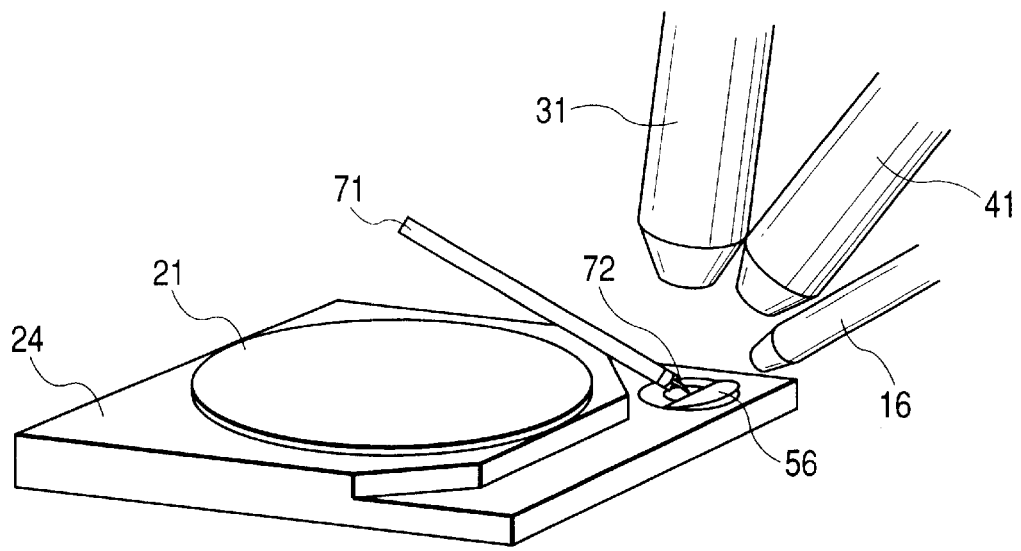
FIG. 11 is a detailed view of main parts in a second exemplary embodiment of the present invention.
Figure 12:
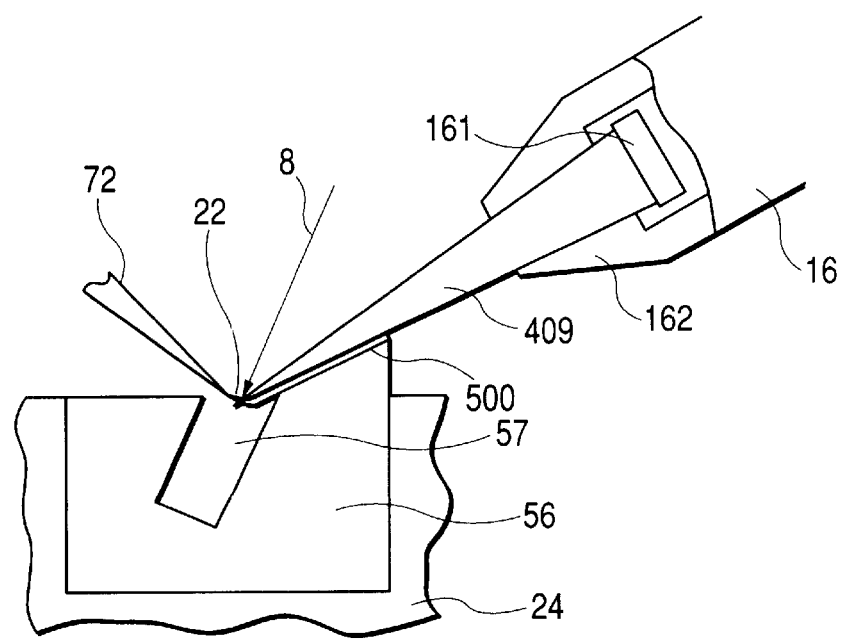
FIG. 12 is an enlarged cross-sectional view showing main parts in a second exemplary embodiment of the present invention.

Referring to FIG. 11 and FIG. 12, an outlined structure of an apparatus for observing samples of a second exemplary embodiment according to the present invention will be described. In addition to the basic structure of an apparatus for observing samples shown in FIG. 3, the present embodiment uses a light element piece 56 of carbon buried in a sample stage 24 as shown in FIG. 11, instead of using a light element piece provided on a tip of a second manipulator (light element piece introduction unit) 55. The sample stage 24 preferably has a surface for placing the sample 21 and a surface lower than the placing surface by about 5 mm. The lower surface has the light element piece 56 placed thereon.

FIG. 12 is a detailed cross-sectional view of main parts including the light element piece 56. The light element piece 56 has a hole 57 in a direction for irradiating the electron beam for observing the micro sample 22 at the center thereof. An exemplary diameter of the hole 57 is 1 mm and a depth thereof is 2 mm. The light element piece 56 has a portion projecting toward the x-ray detector 16, and this portion has a carbon board 500 extending to an upper central portion of the hole 57 fixed thereon. The micro sample 22 is extracted by the focused ion beam from the sample 21 and processed as required. The manipulator and the sample stage 24 move such that the micro sample 22 moves to the center of the opening of the hole 57. The sample held by a probe 72 touches a tip of the carbon board 500 so as to observe the sample. Due to the contact, it is possible to reduce an influence from vibration of the micro sample at a time of observation.

An upper surface of the carbon board 500 is placed such that it is matched to a lower border of x-ray detection angle 409 restricted by a collimator 162. A part of the x-rays generated by the electron beam 8 transmitting through the micro sample 22 and scattered to collide with an inner surface of the hole 57 are absorbed by a thick light element piece and a peripheral metal piece. Accordingly, the x-ray spectrum to be observed includes less background noise, thus enabling accurate and sensitive elemental analysis.

Furthermore, in the present embodiment, there is a difference in height between a place for setting the sample and observing the micro sample by moving to the light element piece 56. Therefore, it is possible to increase the distance (working distance) from the electron irradiating optical system 41, thereby enabling a narrowing of the electron beam even under a high acceleration voltage. In the present embodiment, it is possible to observe under acceleration voltage of 15 kV. Accordingly, it becomes easier to detect an element whose x-ray peak overlaps and is not discriminated by electron beam irradiation of low accelerating voltage. Moreover, an electron beam of higher accelerating voltage scatters less in the micro sample, and does not diffuse, thereby enabling to observe element distribution of the micro sample in high spatial resolution.

The embodiment shows an example with one light element piece 56 set therefor. Alternatively, a plurality of light element pieces may be disposed around the sample 21. In this case, the micro sample is moved to the light element piece located nearest to a portion of the sample where the micro sample is taken, thereby enabling to start observation in shorter period of time.

As described above, the observation condition of the micro sample 22 becomes desirable due to at least the following reasons: it is possible to adjust an angle for observation analysis to a desirable degree including for a vertical observation; it is possible to observe while placing the sample in a sample chamber under vacuum atmosphere; it is possible to avoid vibration during the micro sample observation by fixing the micro sample to the light element piece; it is possible to obtain an x-ray spectrum with low background noise; and it is possible to use electron beam of high accelerating voltage. Accordingly, it is possible to avoid the degrading of the resolution as found in the conventional apparatus, and it is possible to make optimal and minute observations and analysis rapidly and efficiently. As a result, it is possible to make high quality observation analysis of high throughput.

Third Exemplary Embodiment

Figure 13:
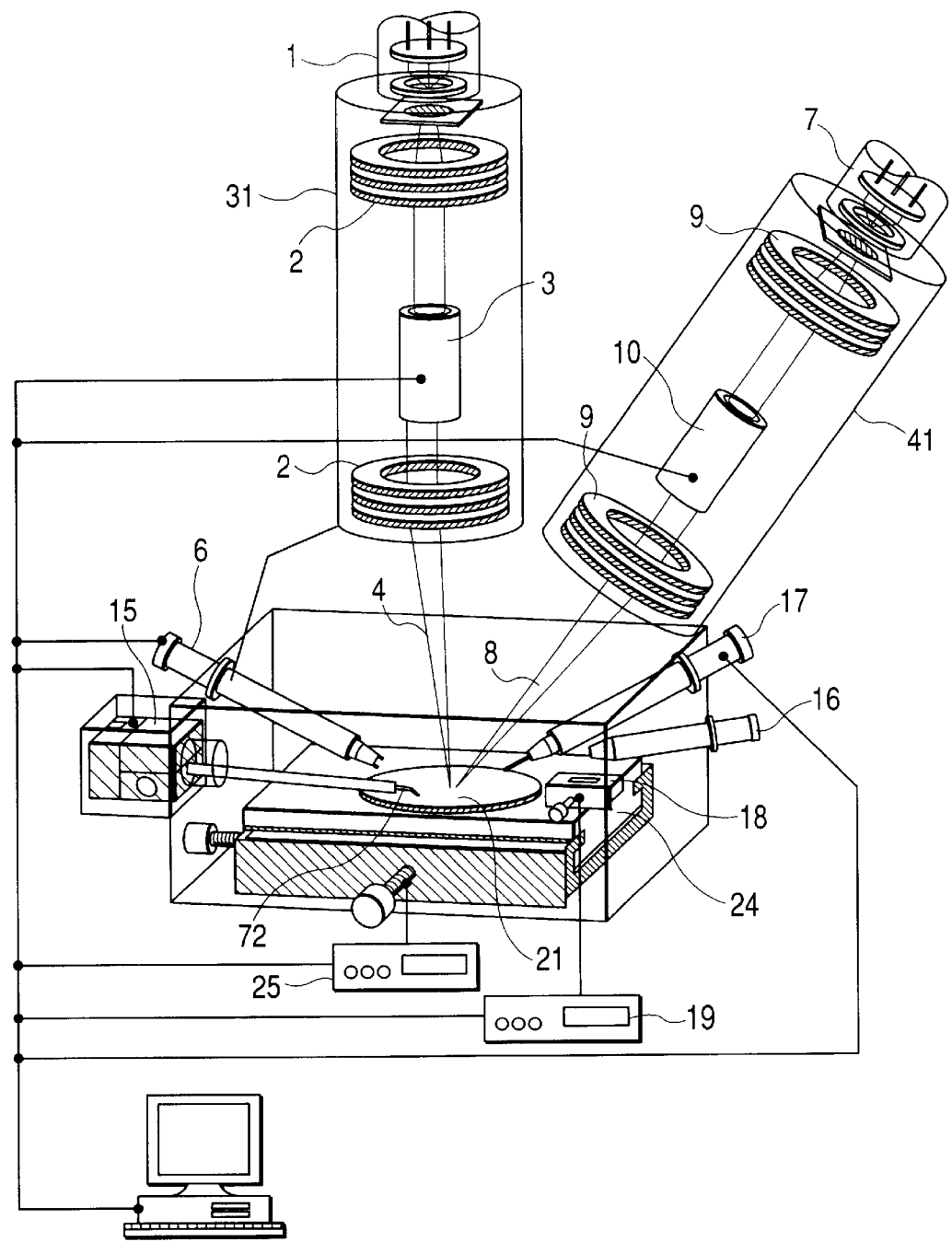
FIG. 13 is a diagram showing an overall structure of an apparatus according to a third exemplary embodiment of the present invention.

Referring now to FIG. 13, an outlined structure of an apparatus for observing samples according to a third exemplary embodiment of the present invention will be described. In addition to the basic structure of the apparatus for observing samples shown in FIG. 3, the embodiment has a third sample stage 18 and a second sample stage controller 19 for controlling the angle and height of the third sample stage instead of a second manipulator (light element piece introduction unit) 55 having a light element piece on a tip thereof. A micro sample is taken out as the same way as in the first exemplary embodiment in the present embodiment, i.e., the focused ion beam irradiation optical system 31 irradiates an ion beam to the sample so as to extract the micro sample from a wafer. In the present embodiment, instead of making an observation and analysis of the micro sample while supporting it by the manipulator, the observation and analysis are made while fixing the micro sample on the third stage.

Figure 14:
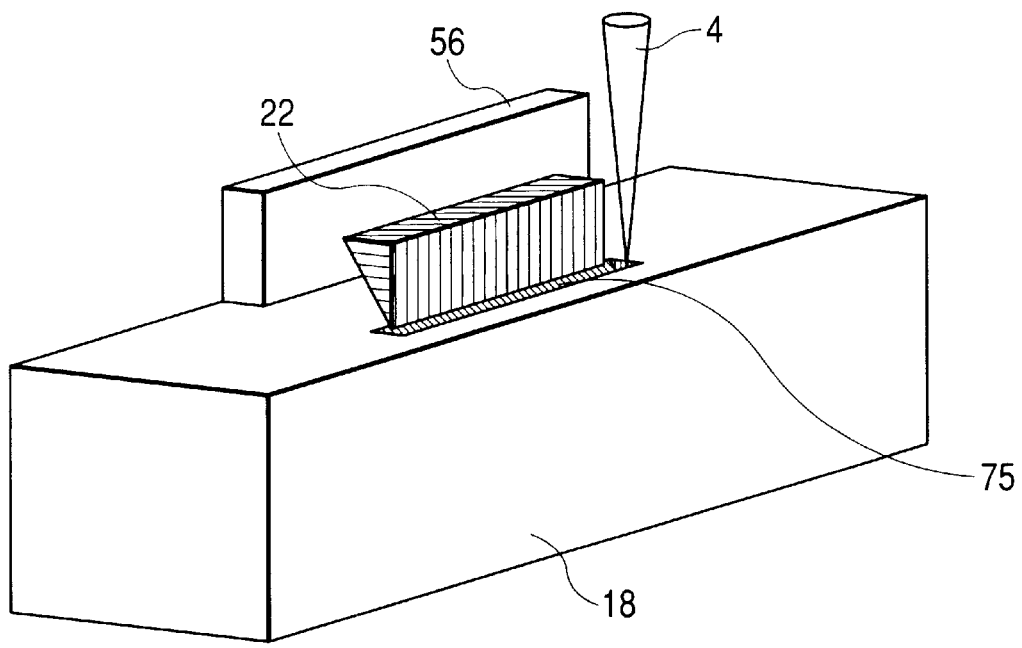
FIG. 14 is a detailed view of main parts in a third exemplary embodiment of the present invention.

FIG. 14 shows the micro sample 22 fixed on the third sample stage 18. In the embodiment, on a back surface of a micro sample fixing part of the third sample stage 18, the light element piece 56 comprised of carbon is set. A bottom surface of the micro sample is in contact with the third sample stage 18 such that an observation surface of the micro sample 22 is positioned opposite from the light element piece 56. The micro sample 22 is fixed on the third sample stage 18 by an ion assisted deposition film 75 deposited by the FIB 4 depositing deposition gas to a contact point between the third sample stage 18 and the micro sample 22. In order to prevent the surface of the observation cross-section 21 from erosion or contamination when making the micro sample 22 or depositing the deposition gas, the observation cross sections 21 may be formed in the following manner: the third sample stage is operated so as to set an angle of irradiation of the FIB 4 to be parallel to the observation cross section of the micro sample, and thereafter, the FIB 4 is irradiated to form a desirable observation cross section 21. The electron beam is irradiated from the opposite side of the light element piece 56 so as to observe the cross section.

Figure 15:
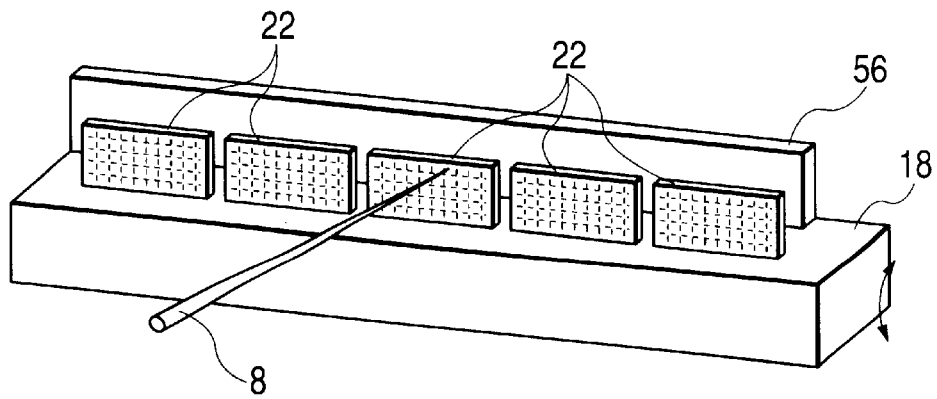
FIG. 15 is a detailed view of main parts in a third exemplary embodiment of the present invention.

By fixing a plurality of micro samples on the third sample stage shown in FIG. 15, a plurality of micro samples can be dealt with continuously. The micro sample 22 is extracted from the wafer 21 so as to be fixed on an appropriate position of the third sample stage 18 placed on the side of the sample stage, and thereafter the next micro sample 22 is extracted in the same manner. By repeating the above-mentioned process, it is possible to make cross-sectional observation and elemental analysis of a plurality of micro samples with the wafer 21 being fixed on the sample stage 24. Thus, it is possible to efficiently examine a distribution of cross-sectional structure over an entire wafer 21. In FIG. 15, if the sample is observed and analyzed while adjusting a stopping orientation of the sample stage 24 and an angle of the third sample stage 18 appropriately such that the micro sample 22 is perpendicular to the electron beam 8 with several micro samples fixed on the third sample stage 18, comparative or continuous and repeated observation and analysis of a plurality of micro samples is possible. Thus, it is possible to examine the cross sectional structure of the overall wafer 21 for its elemental distribution minutely and efficiently.

As described above, according to the third exemplary embodiment the observation condition of the micro sample 22 becomes desirable due to at least the following reasons: it is possible to obtain secondary electron detection efficiency comparable to a case for observing the wafer surface; it is possible to adjust an angle for observation analysis to a desirable degree including for a vertical observation; it is possible to observe while placing the sample in a sample chamber under vacuum atmosphere; and it is possible to avoid vibration during the micro sample observation by fixing the micro sample separated from the manipulator to the third sample stage. Accordingly, it is possible to avoid the degradation of the resolution as seen in the conventional apparatus, and it is possible to make optimal and minute observation and analysis both rapidly and efficiently. As a result, it is possible to make high quality observations and analysis of high throughput.

In the present embodiment, the micro sample taken by the first manipulator is fixed on a third sample stage for observation. Alternatively, the present invention is applicable in such a manner that the micro sample may be placed on the third sample stage below the first manipulator while being fixed on the manipulator, which adjusts an orientation of the micro sample for sample observation. Moreover, whether or not the micro sample is apart from the third sample stage is not essential, and it may be in contact therewith.

Fourth Exemplary Embodiment

Figure 16:
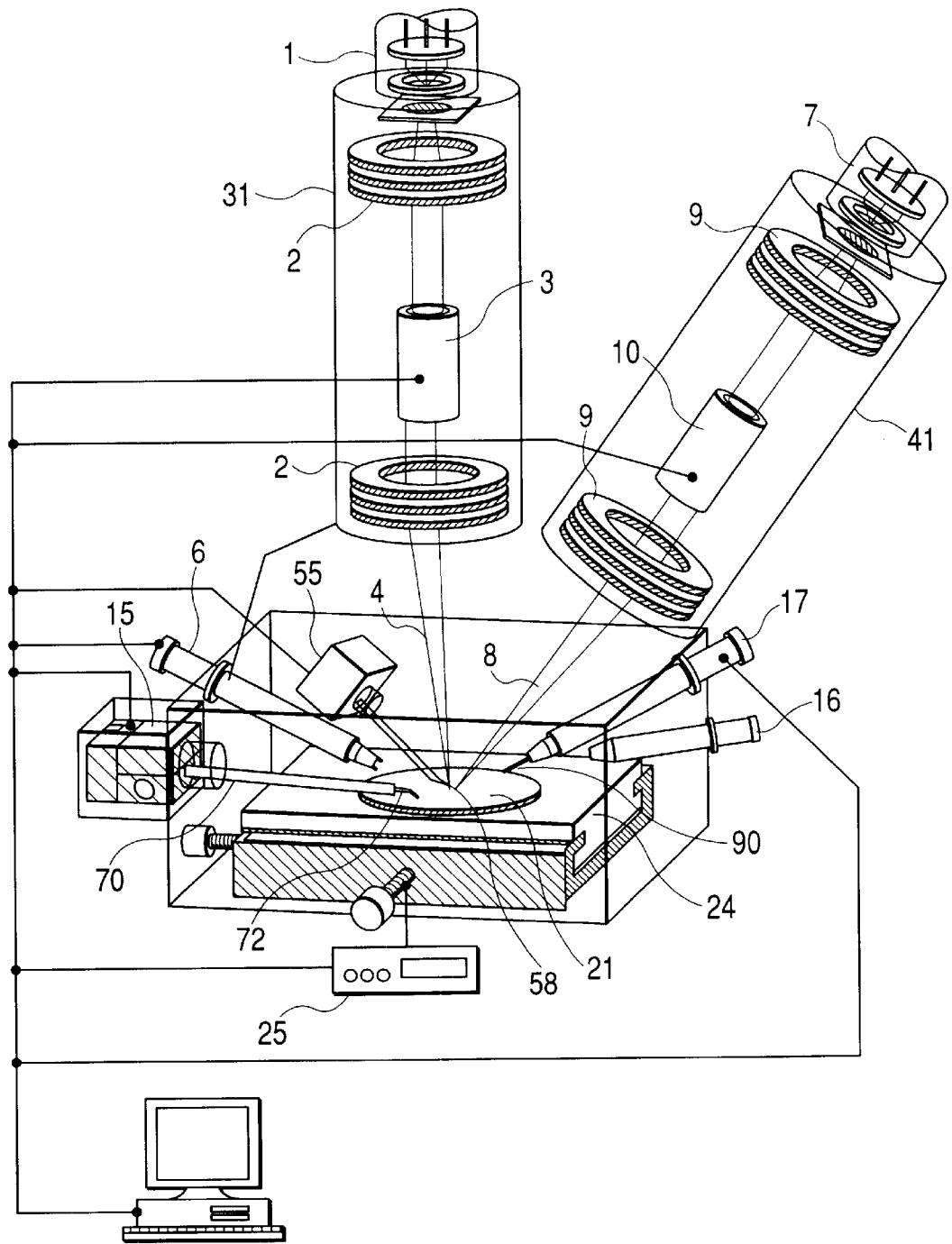
FIG. 16 is a diagram showing an overall structure of an apparatus according to a fourth exemplary embodiment of the present invention.
Figure 17:
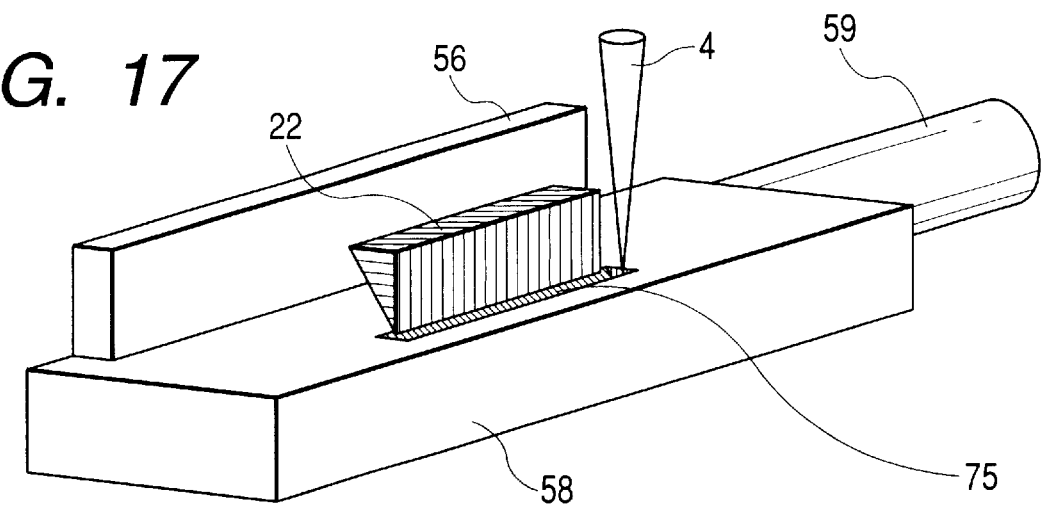
FIG. 17 is a detailed view of main parts in a fourth exemplary embodiment of the present invention.

An outlined structure of an apparatus for observing samples according to a fourth exemplary embodiment of the present invention will be described with reference to FIGS. 16 and 17. In addition to the basic structure of the apparatus for observing samples shown in FIG. 3, the embodiment uses a third sample stage 58 shown in FIG. 17 instead of a light element piece provided on a tip of a second manipulator (light element piece introduction unit) 55. The third sample stage 58 has a light element piece 56 of carbon provided thereto, and the light element piece 56 is attached to a tip of the second manipulator 55 via the sample stage holding rod 59. The sample stage holding rod is designed with a size and material so that the sample stage 58 would not vibrate.

Similar to the first exemplary Embodiment, in the present embodiment, a micro sample is taken from a wafer by irradiating the ion beam from the focused ion beam irradiation optical system 31 to the sample. In the present embodiment, instead of observing and analyzing the micro sample while holding it with the manipulator, the micro sample is observed and analyzed while fixed on the third sample stage 58. FIG. 17 shows the third sample stage 58 has the micro sample 22 fixed thereon.

In the present embodiment, on a back surface of a micro sample fixing part of the third sample stage 58, the light element piece 56 comprised of carbon is set. A bottom surface of the micro sample is in contact with the third sample stage 58 such that an observation surface of the micro sample 22 is positioned opposite from the light element piece 56. The micro sample 22 is fixed on the third sample stage 58 by an ion assisted deposition film 75 deposited by the FIB 4 depositing deposition gas to a contact point between the third sample stage 58 and the micro sample 22. In order to prevent the surface of the observation cross-section 21 from erosion or contamination when making the micro sample 22 or depositing the deposition gas, the observation cross sections 21 may be formed in the following manner: the third sample stage is operated so as to set an angle of irradiation of the FIB 4 to be parallel to the observation cross section of the micro sample, and thereafter, the FIB 4 is irradiated to form a desirable observation cross section 21. The electron beam is irradiated from the opposite side of the light element piece 56 so as to observe the cross section.

As described in the third exemplary embodiment, the present embodiment also makes it possible to deal with a plurality of micro samples. The micro sample 22 is extracted from the wafer 21 so as to be fixed on an appropriate position of the third sample stage 58 placed on the side of the sample stage, and thereafter the next micro sample 22 is extracted in the same manner. By repeating the above-mentioned process, it is possible to make cross-sectional observation and elemental analysis of a plurality of micro samples with the wafer 21 being fixed to the sample stage 24. Thus, it is possible to efficiently examine a distribution of cross-sectional structure over an entire wafer 21.

As described above, according to the fourth exemplary embodiment the observation condition of the micro sample 22 become desirable due to at least the following reasons: it is possible to obtain secondary electron detection efficiency comparable to a case for observing the wafer surface; it is possible to adjust an angle for observation analysis to a desirable degree including for a vertical observation; it is possible to observe while placing the sample in a sample chamber under vacuum atmosphere; and it is possible to avoid vibration during the micro sample observation by fixing the micro sample separated from the manipulator for extraction to the third sample stage. Accordingly, it is possible to avoid a degradation of the resolution as seen in the conventional apparatus, and it is possible to make optimal and minute observations and analysis rapidly and efficiently. As a result, it is possible to make high quality observations and analysis of high throughput.

Fifth Exemplary Embodiment

Figure 18:
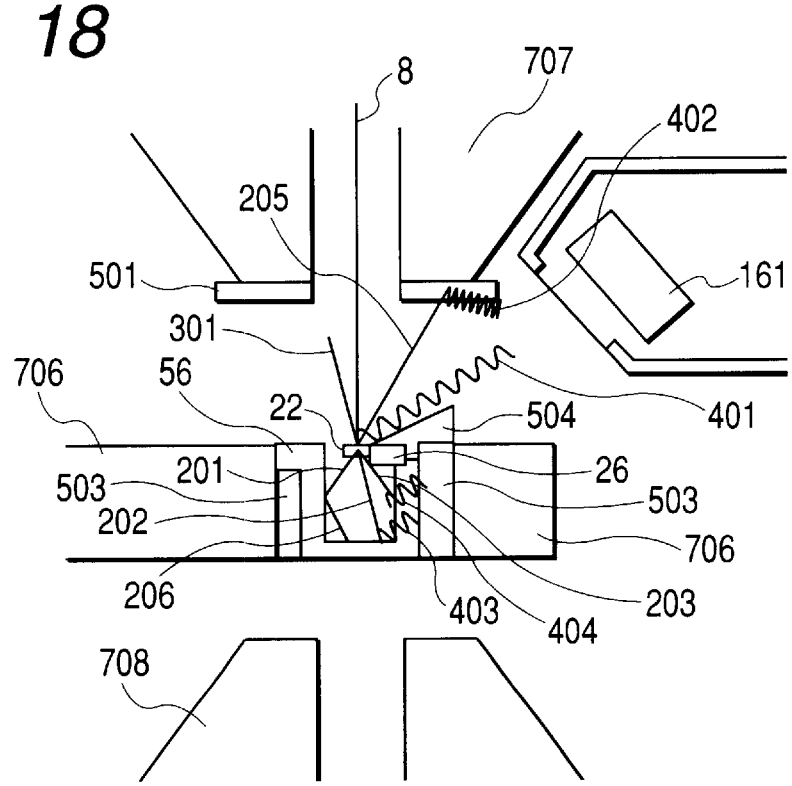
FIG. 18 is a detailed view of main parts in a fifth exemplary embodiment of the present invention.

Referring to FIG. 18, an outlined structure of an apparatus for observing samples according to a fifth exemplary embodiment of the present invention will be described. In the present embodiment, the in-lens type scanning electron microscope described in the Background is applied to the present invention. FIG. 18 shows a detailed view of the circumference of an objective lens of the electron microscope. The term "in-lens type" used herein means a scanning electron microscope that observes a sample on a sample stage, with both disposed in the objective lens.

As shown in FIG. 18, in the embodiment, a thin film sample 22 set on a sample stage 706 is introduced in a space between the magnetic poles 707 and 708 of the objective lens disposed top and bottom, respectively, so as to observe the sample. The thin film sample 22 may be either one of: a sample that is processed to make it a thin film by a method described in the first embodiment by an FIB processing device so as to include a desirable observation area; a sample made into a thin-film by conventional mechanical grinding or ion-milling; or a powder fixed on a thin film of carbon-hydrate system. The thin film sample 22 is fixed on a semicircle supporting body 26 called a "mesh".

A carbon piece 56 in a cylindrical shape having a hole as a characteristic of the present invention and a flange is provided below the thin film sample 22. A diameter of the hole is 1 mm, a depth, 1.5 mm and a thickness of a bottom thereof, 0.5 mm. An x-ray detecting element 161 is disposed on an upper right of the thin film sample 22. The electron beam 8 scans over the thin film sample 22, and the x-ray detecting element 161 detects x-rays 401 generated from the sample so as to make elemental analysis of the thin film sample 22.

A carbon board 501 is set on a lower surface of the magnetic pole 707. The electron beam 8 irradiates the thin film sample 22 so as to generate reflected electrons 205. The reflected electrons that travel above the sample generate x-rays due to collision. The carbon board 501 reduces such reflected electrons and x-rays. A heavy metal material 503 of tungsten surrounds the carbon piece 56. The heavy metal material 503 decays the x-rays penetrating the carbon piece. The upper portion of the carbon piece 56 on the x-ray detector side has a fixing anchor 504 of a carbon piece set thereto for fixing the carbon piece 56 so as to cover the mesh 26 attaching the thin film sample 22. The fixing anchor 504 has a shape projecting outward so as to contact with a cone connecting a rim of detecting portion of the x-ray detecting element and a electron beam irradiation point of the thin film sample 22. With this shape, x-rays generated by colliding with the scattered electrons in the vicinity of an opening of the hole of the carbon piece 56 are absorbed as much as possible so that the x-rays do not enter into the x-ray detecting element.

The electron beam 8 is not a linear beam, but has some divergence. When electrons at the outermost of the divergence collide with the mesh, the x-rays specific to elements such as Ni, which is a typical material for the mesh, is generated, and the generated x-rays interfere with an accurate elemental analysis of the thin film sample. In the embodiment, the carbon material covers the upper side of the mesh so as to prevent characteristic x-rays of the element comprising the mesh from being generated.

In addition to the effects described above, the electrons transmitting through the thin film sample 22 are incident on the hole of the carbon piece 56, thus enabling to reduction in the background x-rays detected by the x-ray detecting element, and the reflected electrons re-collide with the thin film sample 22 likewise to the effect described with accordance to the first embodiment. The hole of the carbon piece 56 has a bottom having a thickness of 0.5 mm. Therefore, even if an accelerating voltage is 50 kV, the electron beam does not transmit, but is absorbed. Accordingly, in the present embodiment, the magnetic pole 708 on the lower side does not have a carbon board provided therefor.

In the present embodiment, the background x-ray noise and the reflected electrons re-colliding with the thin film sample can be reduced significantly, thus enabling the provision of an apparatus for observing samples that is accurate and sensitive.

Sixth Exemplary Embodiment

Figure 19:
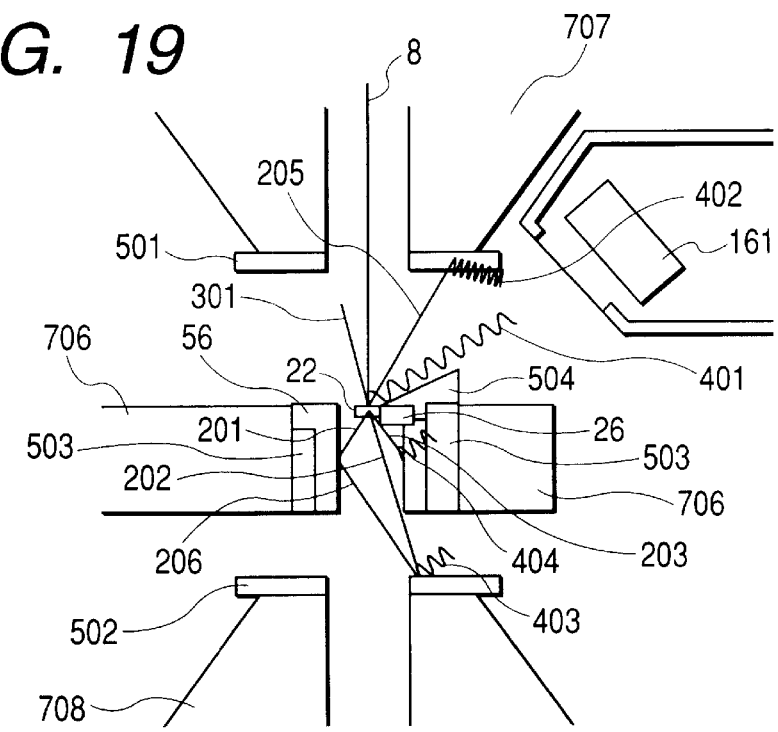
FIG. 19 is a detailed view of main parts in a sixth exemplary embodiment of the present invention.

With reference to FIG. 19, an outlined structure of an apparatus for observing samples according to a sixth exemplary embodiment of the present invention will be described. The embodiment is an example in which the present invention is applied to a scanning transmission electron microscope. FIG. 19 is a detailed view around the objective lens of a scanning transmission electron microscope. It has the same structure as that of the in-lens type scanning electron microscope described in the fifth embodiment. In the case of the transmission electron microscope, the main function thereof is to analyze a structure of atomic arrangement of the sample by observing a diffraction electron beam image of the electron beam having generally the same traveling direction as the incident electron beam among the electron beam transmitting the sample.

Underneath the thin film sample 22, one of the characteristics of the present invention, a carbon piece with a hole, is provided. The thin film sample is provided on a sample stage 706 between an upper magnetic pole 707 and a lower magnetic pole 708. The sample 706 has a mesh 26 attached thereto, and the sample is attached on the mesh. The x-rays generated as the electron beam passes through the sample 22 scatters at or near the sample stage 706 and is irradiated so as to generate additional x-rays therefrom and incident on the detecting element 161. If the x-rays are generated by such irradiation, background noise of the detection signal increases similarly to the above-described embodiments.

In order to prevent such x-rays, the light element piece 56 covers the sample stage 706 against the x-rays. Specifically, the light element piece 56 covers an inner wall of the sample stage 706 having an opening in order to make the electron beam passing though the sample incident on a camera unit (not shown) provided below the lower objective lens. The light element piece 56 may be either screwed shut to the sample stage 706 or fixed by welding. A cylindrical sample holder of the sample stage may have, for example, an internal diameter of 1 mm, a length of 3 to 5 mm and a thickness of 0.5 mm. On an upper right side of the thin film sample 22, an x-ray detecting element 161 is disposed. By detecting the x-rays 401 generated by the electron beam 8 scanning over the thin film sample 22, the thin film sample 22 is analyzed for its elemental composition.

A structure of the sample stage 706 is the same as that described for the fifth exemplary embodiment except that the hole of the carbon piece 56 is a penetrating hole. Because the hole penetrates the carbon piece 56, part of the electrons transmitted through the sample collide with a lower magnetic pole 708 of the objective lens. Therefore, an upper surface of the magnetic pole 708 is covered with the carbon board 502.

In the present embodiment, background x-ray noise and the reflected electron re-colliding with the thin film sample can be reduced significantly, thus enabling the provision of an apparatus for observing a sample that is both accurate and sensitive.

Seventh Exemplary Embodiment

Figure 20:
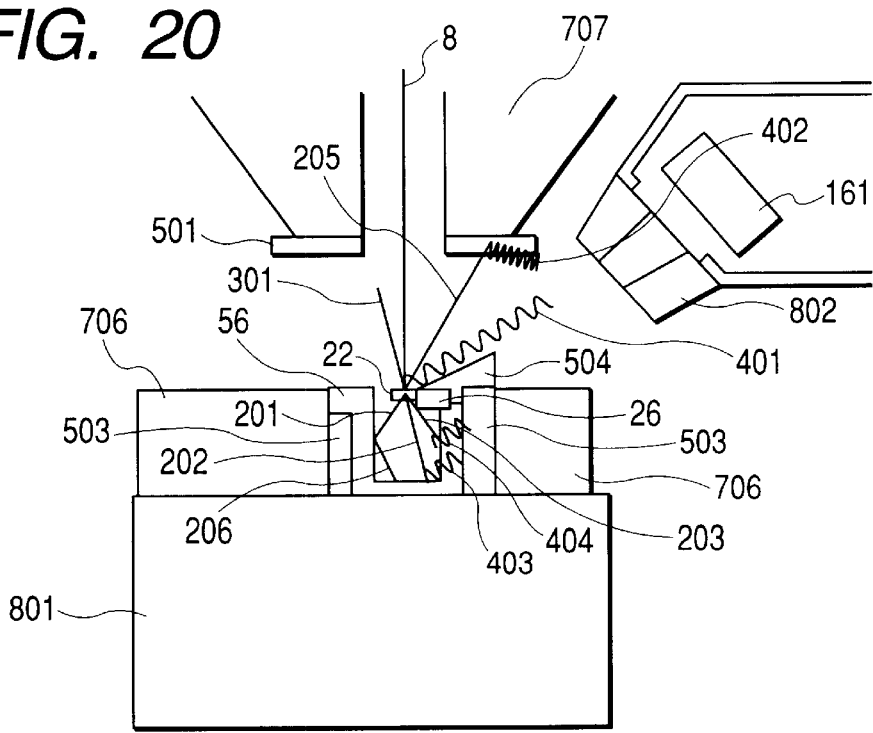
FIG. 20 is a detailed view of main parts in a seventh exemplary embodiment of the present invention.
Figure 21:
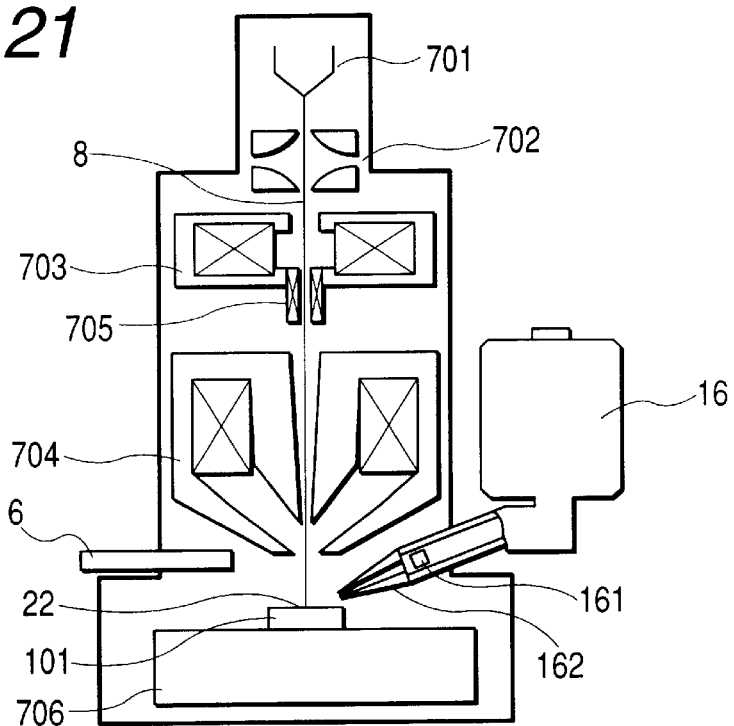
FIG. 21 is a schematic block diagram of a conventional apparatus.
Figure 22:
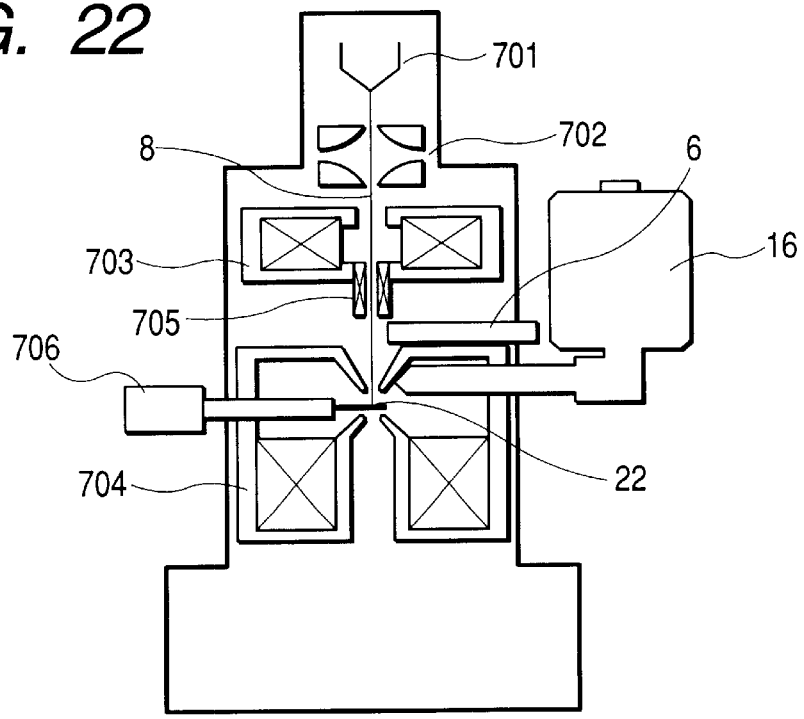
FIG. 22 is a diagram showing a conventional sample fabrication method.
Figure 23:
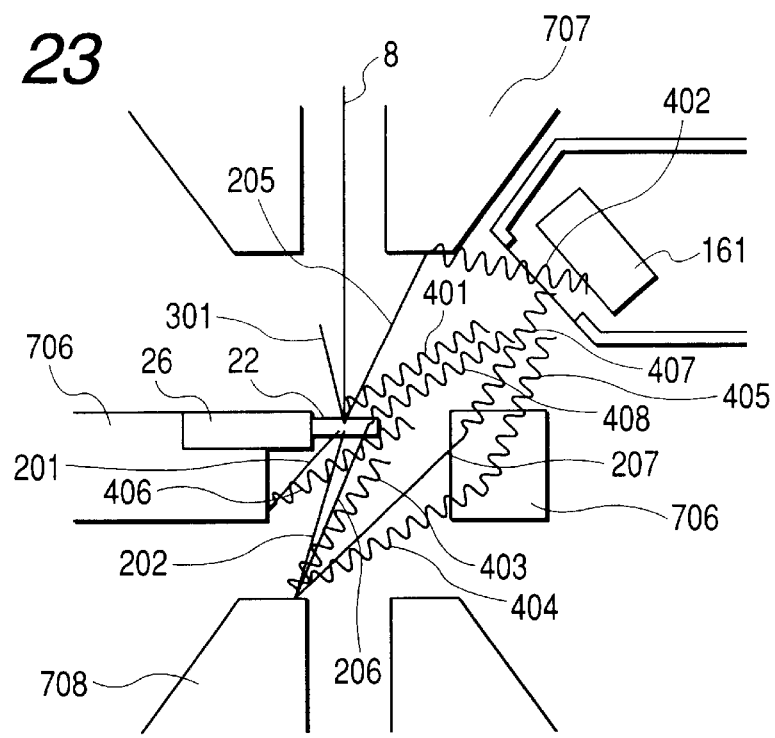
FIG. 23 is a diagram showing a conventional observation method.
Figure 24:
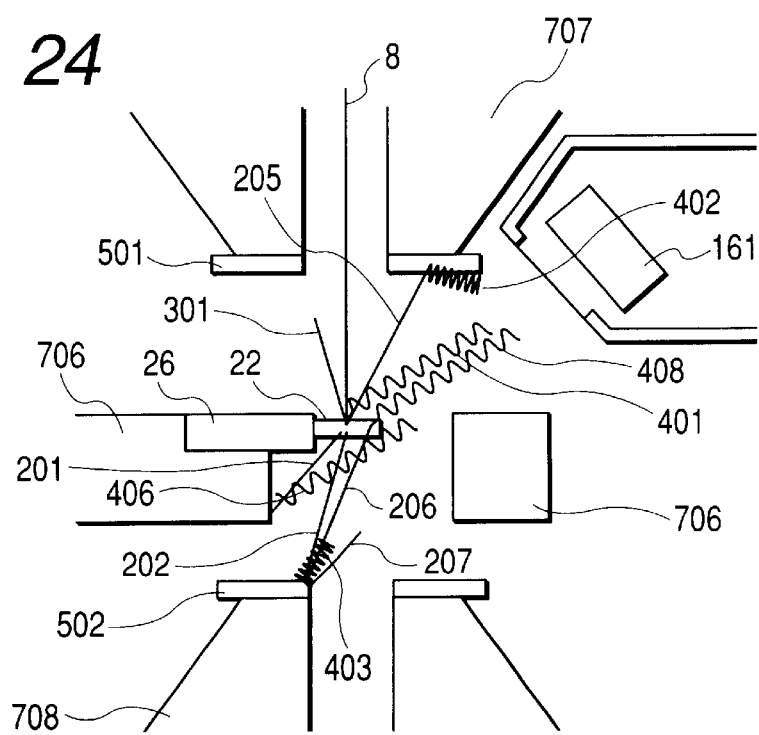
FIG. 24 is a detailed block diagram of a conventional apparatus.

Referring now to FIG. 20, an outlined structure of an apparatus for observing samples according to a seventh exemplary embodiment of the present invention will be described. The present embodiment is an example in which the present invention is applied to a conventional scanning electron microscope. FIG. 20 shows a detailed view around the objective lens of the scanning electron microscope. The objective lens of the electron microscope according to the present embodiment has a magnetic pole 707 only on an upper side of the sample. There is a wide open space below the magnetic pole 707 so that a sample is examined by setting on a large sample stage 801.

Commonly, the electron microscope of this type generates reflected electrons from this side. In order to prevent the reflected electrons from being incident on the x-ray detecting element 161, a reflected electron rejecter 802 made of a pair of permanent magnets is provided between the sample 22 and the x-ray detecting element 161. A principle of the reflected electron rejecter 802 is as follows. A pair of permanent magnets is placed so as to interpose a space between an observation point of the sample 22 and a detection surface of the x-ray detecting element 161. The magnetic field created between two magnets prevents the reflected electron from entering into x-ray detecting element 161. Although it was not indicated clearly in the first four embodiments, the reflected electron rejecter may be housed inside the collimator in these embodiments.

Similarly to the above embodiments, the present embodiment has a carbon piece 56 with a hole provided immediately below the thin film sample 22. In the embodiment, the background x-ray noise and the reflected electron re-colliding with the thin film sample can be reduced significantly, thus enabling the provision of an apparatus for observing samples that is accurate and sensitive.

In the embodiments above, a piece made from a light elemental material is used as an example. Alternatively, a piece made from a metal or the like with a light elemental material coated thereon may be used. In this case, the light elemental material for coating needs to be thick enough to prevent the electron beam from transmitting therethrough.

In summary, an apparatus for observing samples in provided, comprising: an electron beam irradiating optical system having an electron source, a lens for focusing electron beam, and an electron beam scanning deflector; a sample stage upon which a sample is placed; and an electron beam detector for detecting the electron generated from the sample when irradiating the electron beam onto the sample, and/or an x-ray detector for detecting x-rays, in which a piece made from a light elemental material, and a piece having a hole (shielding piece) is set on the sample stage behind the sample.

An apparatus for observing samples is also provided, comprising: a focused ion beam irradiation optical system having an ion source, a lens for focusing the ion beam, and an ion beam scanning deflector; an electron beam irradiating optical system having an electron source, a lens for focusing the electron beam, and an electron beam scanning deflector; and a sample stage for placing the sample, in which, the apparatus for observing samples is provided with a function of separating a second sample from the sample by using the focused ion beam, a manipulator for extracting the second sample, and an electron beam detector for detecting the electron generated from the sample by irradiating the electron beam to the micro sample, and/or an x-ray detector for detecting x-rays, and a function of observing the second sample by electron beam by placing a piece with a hole (shielding piece) to the sample stage or between the sample stage and the second sample while the second sample having a light elemental material included behind thereof.

Moreover, in the latter apparatus, the manipulator for extracting the second sample has a manipulator driver for driving the manipulator independently from the sample stage, and has a function of changing an irradiation angle of the charged particle beam for observation to the second sample while holding the second sample thereon.

A means for disposing the shielding piece is to introduce the shielding piece by the second manipulator having the shielding piece on a tip thereof in the space behind the second sample extracted by the manipulator disclosed in a third aspect, i.e., in a space opposite with respect to a element generating the charged particle beam for observation. Moreover, the latter apparatus is characterized in that the second sample stage for placing the second sample having a shielding piece of the light elemental material is provided to the sample stage disclosed in the second aspect.

Furthermore, the present invention is characterized in that a third sample stage that is driven separately from the sample stage for placing the second sample is provided with a function of varying an angle and irradiation position of the charged beam for observation to the micro sample, and having a light element piece disclosed in the first aspect.

The present invention is further characterized in that the shielding piece may be coated with a heavy elemental material, the shielding piece may be comprised of, at least, carbon, beryllium, or a compound of carbon and beryllium, and the thickness is larger than a penetrating depth of the electron beam, and the shielding piece is grounded electrically.

The present invention provides an apparatus for observing samples and a method for observing a micro sample processing that allows for high-resolution, high quality and quick observation inside an LSI device or the like which grow increasingly miniaturized. Moreover, by applying EDX analysis to a micro sample that is made into a thin film so as to accurately analyze the element, it is possible to provide an apparatus for observing samples with a desirable efficiency for cross-sectional observation and analysis.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. An apparatus for observing a sample using an electron beam, comprising:

an electron beam for irradiating on the sample;
   a sample stage on which the sample is placed;
   an x-ray detector for detecting x-rays generated from a micro sample taken from the sample as the electron beam irradiates the micro sample;
   a shielding piece comprised of carbon, beryllium, or an alloy of carbon and beryllium provided between the sample stage and the micro sample for reducing x-rays, wherein said shielding piece is incorporated into a portion of said sample stage, further wherein said micro sample is in contact with said shielding piece portion of the sample stage; and
   at least one additional shielding piece comprised of carbon, beryllium, or an alloy of carbon and beryllium incorporated into at least a second portion of said sample stage.

2. An apparatus for observing a sample using an electron beam, comprising:

an electron beam for irradiating on the sample, wherein said electron beam includes an electron source emitting an electron beam, a lens for focusing the electron beam, a deflector for scanning the electron beam, and an objective lens for irradiating the electron beam on the sample;
   a sample stage on which the sample is placed;
   an x-ray detector for detecting x-rays generated from a micro sample taken from the sample as the electron beam irradiates the micro sample;
   a shielding piece comprised of carbon, beryllium, or an alloy of carbon and beryllium provided between the sample stage and the micro sample for reducing x-rays; and
   a holder provided to the sample stage for holding said sample, said holder including said shielding piece including a tube-like projection into said shielding piece with walls made of carbon, beryllium, or an alloy of carbon and beryllium.

3. The apparatus according to claim 2, wherein the holder is disposed inside the objective lens.

4. An apparatus for observing a sample using an electron beam, comprising:

an electron beam for irradiating on the sample;
   a sample stage on which the sample is placed;
   an x-ray detector for detecting x-rays generated from a micro sample taken from the sample as the electron beam irradiates the micro sample;
   a shielding piece comprised of carbon, beryllium, or an alloy of carbon and beryllium provided between the sample stage and the micro sample for reducing x-rays; and
   a second sample stage provided on the first sample stage, wherein said shielding piece is made a part of the second sample stage, wherein said shielding piece is mounted perpendicular to a surface of said second stage, said micro sample is mounted adjacent to said shielding piece on said second stage surface, and said electron beam is adapted to irradiate the micro sample parallel to said surface of said second stage and perpendicular to said shielding piece.

\* \* \* \* \*